United States Patent
Schmitt et al.

(10) Patent No.: US 11,614,341 B2
(45) Date of Patent: Mar. 28, 2023

(54) METHODS AND DEVICES FOR USING MULTI-TURN MAGNETIC SENSORS WITH EXTENDED MAGNETIC WINDOWS

(71) Applicant: Analog Devices International Unlimited Company, Limerick (IE)

(72) Inventors: Jochen Schmitt, Biedenkopf (DE); Enda Joseph Nicholl, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 473 days.

(21) Appl. No.: 16/008,869

(22) Filed: Jun. 14, 2018

(65) Prior Publication Data

US 2019/0383643 A1 Dec. 19, 2019

(51) Int. Cl.
*G01D 5/14* (2006.01)
*G01D 5/16* (2006.01)
*G01R 33/09* (2006.01)
*B62D 15/02* (2006.01)

(52) U.S. Cl.
CPC .......... *G01D 5/145* (2013.01); *B62D 15/0215* (2013.01); *G01D 5/16* (2013.01); *G01R 33/093* (2013.01)

(58) Field of Classification Search
CPC ........ G01D 5/142; G01D 5/145; G01D 5/147; G01D 5/16; B62D 15/0215; G01R 33/06; G01R 33/07; G01R 33/072; G01R 33/075; G01R 33/077; G01R 33/09; G01R 33/091; G01R 33/093; G01R 33/095; G01R 33/096; G01R 33/098; G01R 33/1292; G01B 7/30; G01B 7/14
See application file for complete search history.

(56) References Cited

U.S. PATENT DOCUMENTS

| 6,492,807 | B2 | 12/2002 | Spellman |
| 6,775,109 | B2 | 8/2004 | Gambino et al. |
| 7,017,274 | B2 | 3/2006 | Stobbe |
| 7,423,420 | B2 | 9/2008 | Meyersweissflog |

(Continued)

FOREIGN PATENT DOCUMENTS

| DE | 102010010893 | 9/2010 |
| JP | 2007-232589 | 9/2007 |

(Continued)

OTHER PUBLICATIONS

Office Action received in Japanese Patent Application JP2019-110290 dated Aug. 17, 2020.

(Continued)

*Primary Examiner* — David M Schindler
(74) *Attorney, Agent, or Firm* — Knobbe, Martens, Olson & Bear, LLP

(57) ABSTRACT

A system includes a magnetic sensor that can store a magnetic state associated with a number of accumulated turns of a magnetic target. The magnetic sensor may work in conjunction with a magnetic target. The magnetic target may produce a magnetic field that, at some positions, drops below a magnetic window of the magnetic sensor. The magnetic target may produce a magnetic field that is within the magnetic window when needed to update the magnetic state of the sensor to keep track of the accumulated turns of the magnetic target. The magnetic sensor may be initialized with one or more domain walls.

23 Claims, 15 Drawing Sheets

(56) References Cited

U.S. PATENT DOCUMENTS

| | | | |
|---|---|---|---|
| 7,466,788 B2 | 12/2008 | Hoover et al. | |
| 7,472,004 B2 | 12/2008 | Hara et al. | |
| 8,089,269 B2* | 1/2012 | Tomioka | G01D 5/2457 |
| | | | 324/207.2 |
| 8,618,466 B2 | 12/2013 | Ehrenberg et al. | |
| 9,350,216 B2 | 5/2016 | Labriola, II | |
| 9,803,997 B2* | 10/2017 | Putinier | G01D 5/145 |
| 2007/0205759 A1 | 9/2007 | Ito | |
| 2010/0301842 A1 | 12/2010 | Mattheis | |
| 2015/0192433 A1* | 7/2015 | Onodera | G01D 5/145 |
| | | | 324/207.21 |
| 2016/0265941 A1 | 9/2016 | Mattheis et al. | |
| 2017/0261345 A1 | 9/2017 | Schmitt | |
| 2018/0172477 A1* | 6/2018 | Dietrich | G01D 5/16 |
| 2018/0372510 A1* | 12/2018 | Mattheis | G01D 5/145 |

FOREIGN PATENT DOCUMENTS

| | | |
|---|---|---|
| JP | 2017-161524 | 9/2017 |
| WO | WO 2008-098594 | 8/2008 |
| WO | WO 2015-062573 | 5/2015 |

OTHER PUBLICATIONS

Novotechnik, "How to Substantially Reduce Encoder Cost While Gaining Functionality with Multi-Turn Rotary Position Sensors", White Paper, 8 pages. Available at: http://www.novotechnik.com/pdfs/MultiturnWhitePaperV4.pdf (accessed: Jun. 14, 2018).

Decision of Refusal received in JP Application No. 2019-110290 dated Feb. 1, 2021.

Decision to Grant received for Japanese Patent Application No. 2019-110290 dated Jul. 5, 2021.

* cited by examiner

METHODS AND DEVICES FOR USING MULTI-TURN MAGNETIC SENSORS WITH EXTENDED MAGNETIC WINDOWS

FIELD OF DISCLOSURE

The described technology relates to magnetic sensors and related systems and methods.

BACKGROUND

Rotation counters that can measure angles greater than 360° are used in a variety of applications and are often referred to as multi-turn counters. One implementation of a multi-turn counter uses the magnetoresistance phenomenon, in which ferromagnetic layers are separated by a thin non-magnetic film. A multi-turn counter based upon the magnetoresistance phenomenon has various desirable properties. It can be desirable to keep the strength of the magnetic field generated by a rotating magnetic target and sensed by the sensor remain within a relatively narrow magnetic window. If the strength of the magnetic field is too low, the sensor can be unable to properly record rotation of the magnetic target. Conversely, if the strength of the magnetic field is too high, the magnetic field can scramble the data recorded by the sensor. In either case, the rotation count from the sensor can no longer be trusted. The difference between the minimum and maximum acceptable magnetic field strengths can be referred to as a magnetic window.

In various applications, it can be difficult to provide a magnetic target that provides a magnetic field that remains within the magnetic window for all rotation angles of the target. As an example, applications where the magnetic target cannot be located on the end of a rotating shaft can involve impracticably large magnetic windows.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

One aspect of this disclosure is a method of recording a number of turns with a multi-turn magnetic sensor using an extended magnetic window. The method comprises applying a magnetic field to the multi-turn magnetic sensor, where the magnetic field is pointing outside of an area for which domain wall propagation in the multi-turn magnetic sensor is expected and where the magnetic field has a first strength below a range for which domain walls predictably propagate through the multi-turn magnetic sensor. The method includes, while the magnetic field is pointing outside of the area, increasing the strength of the magnetic field to a second strength within the range for which domain walls predictably propagate through the multi-turn magnetic sensor and, while the magnetic field has the second strength, turning the magnetic field such that the magnetic field vector is pointing within the area so as to adjust a state of the multi-turn magnetic sensor.

The method can include applying the magnetic field to the multi-turn magnetic sensor with a magnetic target and rotating the magnetic target relative to the multi-turn magnetic sensor or linearly translating the magnetic target relative to the multi-turn magnetic sensor.

The method can include applying, with an initialization magnet separate from the magnetic target and to the multi-turn magnetic sensor, an initialization magnetic field having a third strength that is within the range for which domain walls predictably propagate through the multi-turn magnetic sensor and turning the initialization magnetic field relative to the multi-turn magnetic sensor in order to produce at least one domain wall in the multi-turn magnetic sensor.

The method can include, while the magnetic field is pointing outside the area, reducing the magnetic field to a third strength below a range for which any propagation of domain walls through the multi-turn magnetic sensor is expected.

Another aspect of this disclosure is a multi-turn magnetic sensing system with an extended magnetic window. The multi turn magnetic sensing system comprises a multi-turn magnetic sensor having magnetoresistive elements and being configured to record a number of turns of a magnetic field based on domain wall propagation through the multi-turn magnetic sensor and a magnetic target configured to move between a first position relative to the multi-turn magnetic sensor and a second position relative to the multi-turn magnetic sensor. The magnetic target can be configured such that, in the first position, the magnetic target is configured to apply the magnetic field with a first strength to the multi turn magnetic sensor, the first strength being below a range for which domain walls predictably propagate through the multi-turn magnetic sensor and, in the second position, the magnetic target is configured to apply the magnetic field with a second strength to the multi turn magnetic sensor, the second strength being in the range for which domain walls predictably propagate through the multi-turn magnetic sensor.

The magnetic target can include a first portion of magnetic material that forms a first magnetic dipole and a second portion of the magnetic material that forms a second magnetic dipole, where the first magnetic dipole is reversed relative to the second magnetic dipole, where the first and second portions of the magnetic material are disposed along a substantially circular circumference, and where at least some the first portion of the magnetic material is disposed adjacent to the second portion of the magnetic material.

When the magnetic target is in the first position, the second portion of the magnetic material can be disposed away from the multi-turn magnetic sensor. When the magnetic target is in the second position, the second portion of the magnetic material can be disposed adjacent to the multi-turn magnetic sensor.

The substantially circular circumference of the magnetic material can define a circle having a center. The first magnetic dipole can be oriented such that the first magnetic dipole has a north magnetic pole pointing towards the center of the circle and a south magnetic pole pointing away from the center of the circle. The second magnetic dipole can be oriented such that the second magnetic dipole has a south magnetic pole pointing towards the center of the circle and a north magnetic pole pointing away from the center of the circle.

The substantially circular circumference of the magnetic material can define a circle that lies in a plane. The first magnetic dipole can be oriented such that the first magnetic dipole has a north magnetic pole pointing normal to the plane and a south magnetic pole pointing anti-normal to the plane. The second magnetic dipole can be oriented such that the second magnetic dipole has a south magnetic pole pointing normal to the plane and a north magnetic pole pointing anti-normal to the plane.

The magnetic target can comprise a ring having the substantially circular circumference, where the first and second portions of the magnetic material together span substantially the entire substantially circular circumference of the ring.

The magnetic target can comprises a third portion of the magnetic material that forms a third magnetic dipole, where the third magnetic dipole is reversed relative to the second magnetic dipole and where the second portion of the magnetic material is disposed between the first and third portions of the magnetic material.

When the magnetic target is in the first position, the second portion of the magnetic material can be disposed away from the multi-turn magnetic sensor. When the magnetic target is in the second position, the second portion of the magnetic material can be disposed adjacent to the multi-turn magnetic sensor.

The magnetic target can comprise a linear magnetic target having an elongated direction and at least one pole pair that is magnetized perpendicular to the elongated direction. The pole pair can be closer to the multi-turn magnetic sensor when the magnetic target is in the first position than when the magnetic target is in the second position.

Another aspect of this disclosure is a magnetic sensing system with an extended magnetic window. The magnetic sensing system includes a magnetic sensor comprising magnetoresistive elements and configured to record position data based on domain wall propagation through the magnetic sensor and a magnetic target arranged relative to the magnetic sensor such that, in a first position relative to the magnetic sensor, the magnetic target is configured to apply a magnetic field with a first strength to the magnetic sensor, the first strength being in a range for which domain walls propagate through the magnetic sensor with a non-zero probability of less than 95% and, in a second position relative to the magnetic sensor, the magnetic target is configured to apply the magnetic field with a second strength to the magnetic sensor, the second strength being in a range for which domain walls predictably propagate through the magnetic sensor.

The magnetic target can be arranged relative to the magnetic sensor such that, in a third position relative to the magnetic sensor, the magnetic target is configured to apply the magnetic field with a third strength to the magnetic sensor, the third strength being in a range for which domain walls are not expected to propagate through the magnetic sensor.

The magnetic target can be shaped in a ring and can have magnetic poles pointing radially inwards towards a center of the ring and pointing radially outwards from the center of the ring.

The magnetic target can be shaped in a ring that lies in a plane and have magnetic poles pointing normal to the plane of the ring and pointing anti-normal to the plane of the ring.

The magnetic target can comprise a linear magnetic target with an elongated direction and have magnetic poles pointing perpendicular to the elongated direction of the linear magnetic target.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

These drawings and the associated description herein are provided to illustrate specific embodiments and are not intended to be limiting.

DETAILED DESCRIPTION

Figure 1:
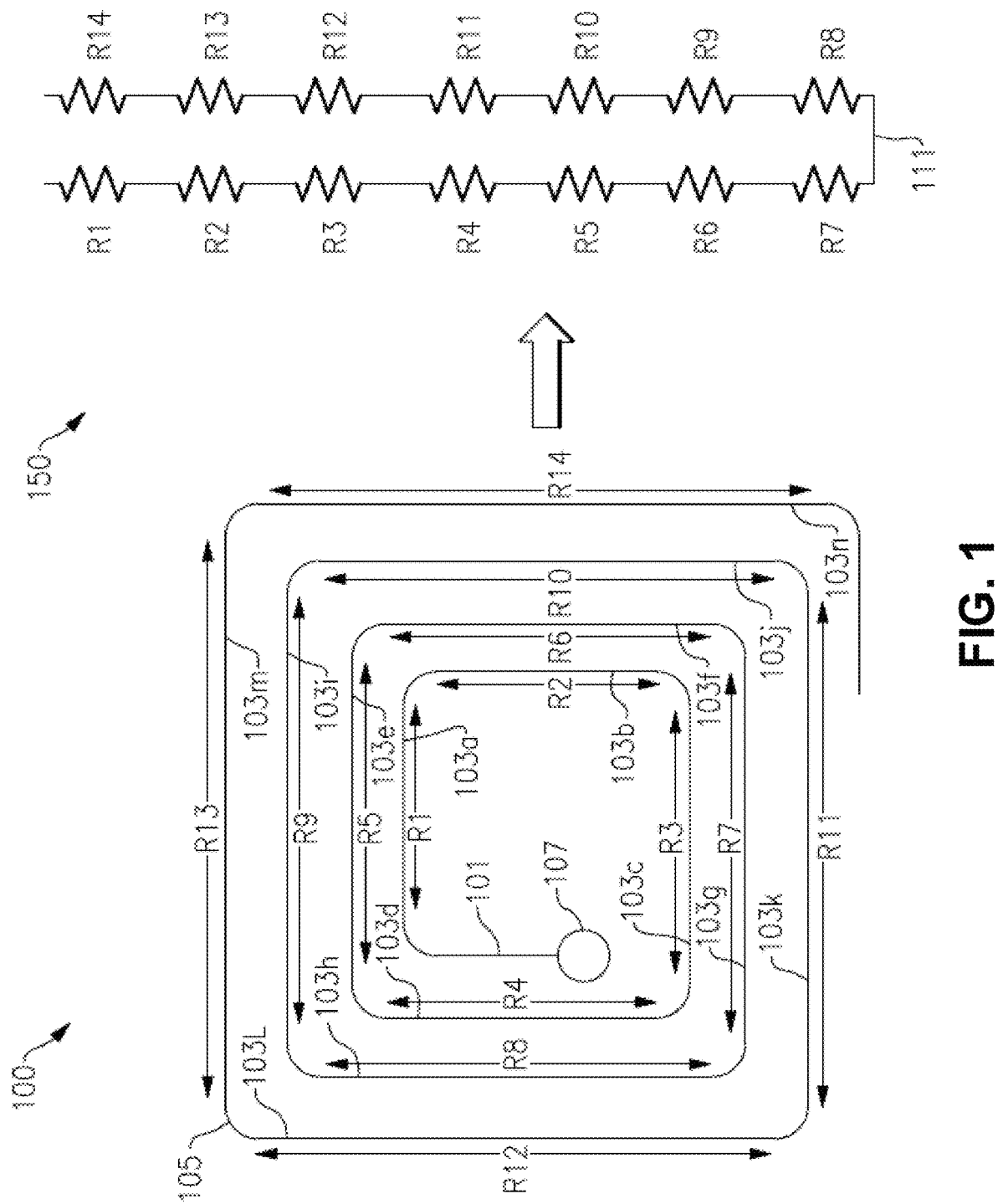
FIG. 1 shows an example magnetic strip layout representation of a multi-turn magnetic sensor with a corresponding circuit schematic representation.

The following detailed description presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects of this disclosure relate to a magnetic sensing system that includes a multi-turn magnetic sensor and a magnetic target. Domain walls can predictably propagate though the multi-turn magnetic sensor when a first strength of a magnetic field generated by the magnetic target is within a range of magnetic field strengths. In a first position, magnetic target can apply the magnetic field having the first magnetic field strength to the multi-turn sensor. The magnetic target can rotate from the first position to a second position. In the second position, the magnetic target can generate a magnetic field having a second magnetic field strength within an area for which no domain wall propagation is expected, in which the second magnetic field strength is below the range of magnetic field strengths for which domain walls predictably propagate though the multi-turn magnetic sensor. The multi-turn magnetic sensor can maintain a state as the magnetic target rotates from the first position to the second position and then to the first position. Accordingly, the magnetic sensing system can operate with magnetic field strengths that have a larger range than various other magnetic sensing systems. Magnetic targets in magnetic sensing systems discussed herein can include less magnetic material than the various other magnetic sensing systems. This can save space and costs.

The magnetic field sensing systems described herein can provide a compact and modular arrangement for measuring turn count in various applications. An example application for the disclosed magnetic field sensors is measuring the turn count of a steering column. In some arrangements, the disclosed magnetic field sensors may be used with magnetic targets whose operating strength can go outside of the traditional magnetic windows of the sensors, while maintaining faultless operation of the sensors. Such arrangements may facilitate sensing turn count of a rotating shaft even if the magnetic sensor is not positioned at an end of the rotating shaft.

In some embodiments, a magnetic strip having a magnetic anisotropy is physically laid out in the shape of a spiral. A domain wall generator coupled to one end of the magnetic strip is configured to generate and transport one or more domain walls through the magnetic strip according to the orientation of a rotating magnetic field. A driving circuit can activate (e.g., provide a voltage and/or current to) a portion of the spiral and a sensing circuit can make an electromagnetic reading associated with the portion of the spiral. As such, the sensing circuit can sense a resistance of an isolated magnetoresistive element of the magnetic strip. A control circuit can control a sequence in which different parts of the spiral can be powered and sensed by a sensing circuit. For instance, the control circuit can control switches to select a particular magnetoresistive element of the spiral for which the sensing circuit can sense a value indicative of resistance. The sensing circuit can make a sequence of electrical readings of the various parts of the spiral associated with magnetic states of the various parts of the spiral. In some instances, the sensing circuit can perform a comparison of the electromagnetic readings. The output of the sensing circuit can be decoded to determine an accumulated turn state of the magnetoresistive elements of the magnetic strip.

FIG. 1 shows an example magnetic strip layout 100 with a corresponding circuit schematic representation 150. FIG. 1 shows a magnetic strip 101 having corners 105 and segments 103a-103n forming magnetoresistive elements R1-R14 arranged in series with each other, and a domain wall generator 107. The magnetoresistive elements can act as variable resistors that change resistances in response to a magnetic alignment state. The magnetic strip 101 illustrated in FIG. 1 can be implemented in a multiturn counter.

The magnetic strip 101 can be a giant magnetoresistance (GMR) track that is physically laid out in the shape of a spiral. As illustrated in FIG. 1, such a spiral shaped magnetic strip 101 can have rounded corners 105 and segments 103a-103n. The magnetic strip 101 can have a magnetic anisotropy, such as a high anisotropy, based on the material and cross sectional dimensions of the magnetic strip 101. The magnetic strip 101 can store magnetic energy. A domain wall generator (DWG) 107 is coupled to one end of the magnetic strip 101. The DWG 107 can have a magnetic anisotropy, such as a low anisotropy. The domain wall generator can generate domain walls in response to rotations in a magnetic field. The domain walls can be injected to the magnetic strip 101.

The segments 103a-103n of the magnetic strip 101 are shown as straight sides of the magnetic strip 101 in the example of FIG. 1. The segments 103a-103n can have a variable resistance based on the magnetic domain of the segment. As the magnetic domain of a segment changes, the resistance of that segment can change. Accordingly, the segments 103a-103n can operate as magnetoresistive elements, also referred to as variable resistors R1-R14 herein. The magnetoresistive elements R1-R14 can also function as nonvolatile, magnetic memory that can be magnetically written and electrically read. The magnetoresistive elements R1-R14, as laid out in the spiral shaped magnetic strip 101, are coupled in series with each other. Corresponding circuit schematic representation 150 shows segments 103a-103n depicted as corresponding magnetoresistive elements R1-R14 connected in series.

Figure 2:
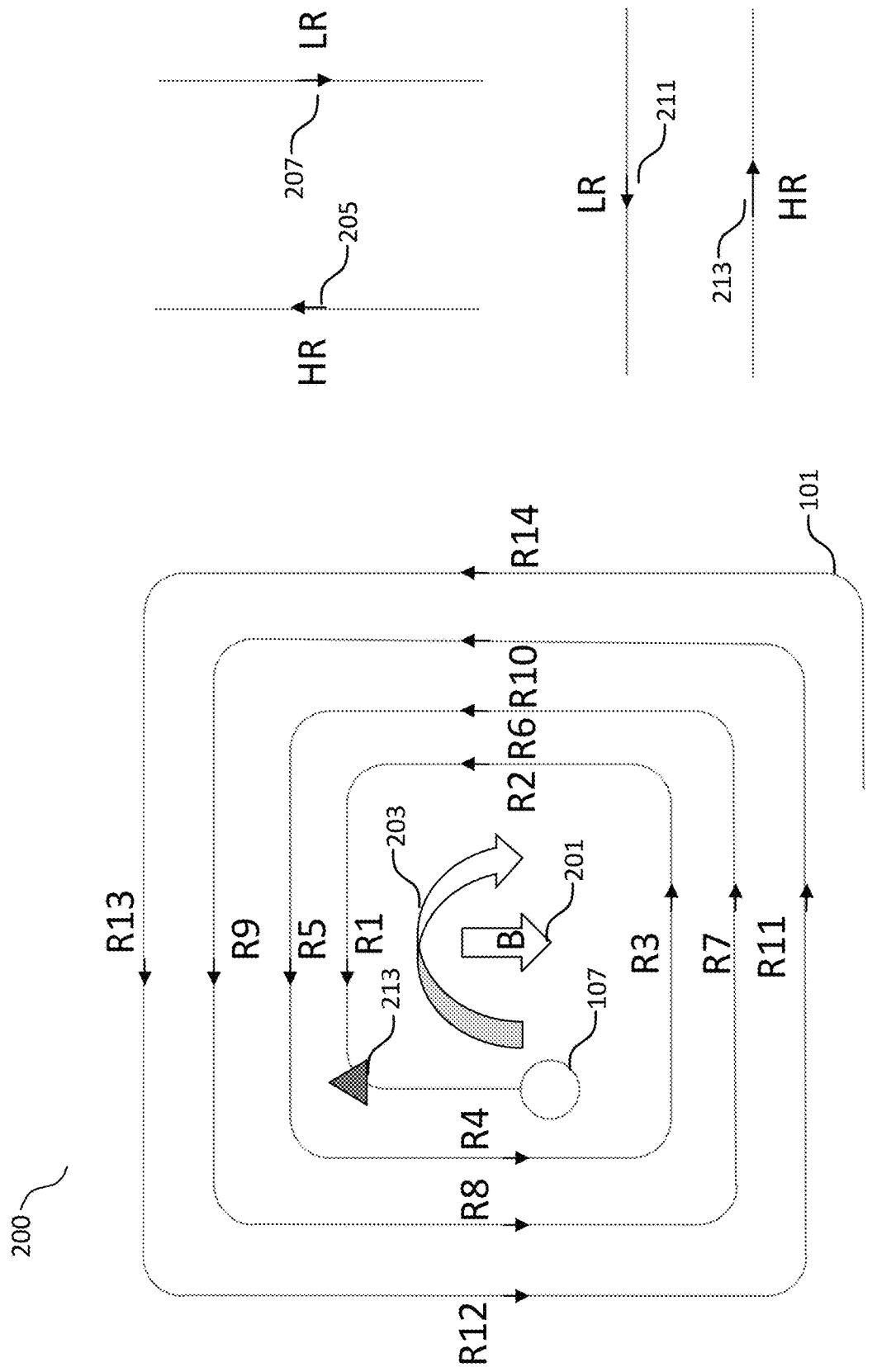
FIG. 2 shows an example magnetic strip layout representation with explanatory symbols.

FIG. 2 shows an example magnetic strip layout representation 200 with explanatory symbols. The magnetic strip 101 with magnetoresistive element segments equivalents R1-R14 of FIG. 1 is shown, along with DWG 107, an external magnetic field 201, an arrow 203 indicating a rotation of the external magnetic field 201, and a domain wall 213. Domain orientations 205, 207, 209, and 211 indicate an orientation of a domain inside of a segment of a magnetic strip.

The DWG 107 can be affected by the external magnetic field 201. As the external magnetic field 201 rotates as indicated by arrow 203, the DWG 107 can inject domain walls 213 through the magnetic strip 101. The domain wall 213 can propagate through the segments as magnetic field 201 rotates and the domain orientations 205, 207, 209, and 211 change. Although FIG. 2 shows the external magnetic field 201 at perpendicular positions for clarity, the magnetic field can be pointed at any angle, such as a 45 degree angle toward the spiral corners.

The resistivity of segments of the magnetic strip 101 can be affected by the domain orientation within a magnetic strip segment. Each segment's domain orientation can cause that segment to have a high resistance ("H" or "HR") or a low resistance ("L" or "LR") depending on the orientation of the segment. Vertically illustrated magnetic strip segments having a domain orientation 205 have a higher resistivity than vertical magnetic strip segments having a domain orientation 207, which have a low resistivity. Horizontally illustrated magnetic strip segments having a domain orientation 213 have a higher resistivity than horizontal magnetic strip segments having a domain orientation 211, which have a low resistivity. The magnetic strip segments with domain orientations 205 and 213 can have comparable resistances. Similarly, the magnetic strip segments with domain orientations 207 and 211 can have comparable resistances.

The examples shown in FIG. 1 and FIG. 2 depict a spiral shaped magnetic strip 101 as an open spiral based on a quadrilateral. However, in some other embodiments, different polygon or elliptical spiral configurations are possible. Also, the spiral can be a closed spiral or a multi-layer spiral with overlapping parts.

As discussed above, it may be desirable for the strength of the magnetic field generated by a rotating magnetic target and sensed by a multi-turn magnetic sensor to remain within a relatively narrow magnetic window, referred to herein as a first magnetic window. The first magnetic window may include the range of magnetic field strengths for which domain walls predictably propagate through a multi-turn magnetic sensor. As such, the first magnetic window may include magnetic fields having strengths at the multi-turn magnetic sensor that are no stronger than a maximum magnetic field strength Hmax and no weaker than a minimum magnetic field strength for reliable domain wall propagation. If the strength of the magnetic field is too high (e.g., above the maximum magnetic field strength Hmax), the magnetic field can create new domain walls, even without rotation of the magnetic field. This can scramble the data recorded by the sensor. Conversely, if the strength of the magnetic field is too low (e.g., below a minimum magnetic field strength for reliable domain wall propagation Hmin), the domain walls may not reliably propagate and the sensor may lose track of the number of rotations of the magnetic target. Thus, it may be desired that the magnetic field stay within the first magnetic window (e.g., between Hmin and Hmax) to ensure faultless operation.

In the present disclosure, multi-turn sensing systems are provided that operate with magnetic fields that go outside the first magnetic window, while still providing faultless operation. As examples, the multi-turn sensing systems provided in the present disclosure may operate with magnetic fields that may be occasionally within a second magnetic window and that may be occasionally within a third magnetic window.

The second magnetic window may include the range of magnetic field strengths for which domain walls propagate through a multi-turn magnetic sensor, but in an unreliable manner. If the strength of the magnetic field is within a second magnetic window (e.g., between a minimum magnetic field strength for reliable domain wall propagation Hmin and a minimum magnetic field strength for domain wall propagation Hmin2, where Hmin2 is less than Hmin), the domain walls may propagate with a certain probability (e.g., with a certainty or probability of less than 1, sometimes referred to as a certainty or probability of less than 95%).

The third magnetic window may include magnetic field strengths that are sufficiently weak that no propagation of domain walls in the multi-turn magnetic sensor is expected to occur. If the strength of the magnetic field is within the third magnetic window (e.g., lower than a minimum magnetic field strength for domain wall propagation Hmin2), the domain walls should not propagate within the sensor regardless of the direction of the magnetic field. The properties of the second and third magnetic window may be used in forming a sensor that operates outside the first magnetic window (e.g., by ensuring that the magnetic field strength is within the first magnetic window during certain periods of time).

Figure 3:
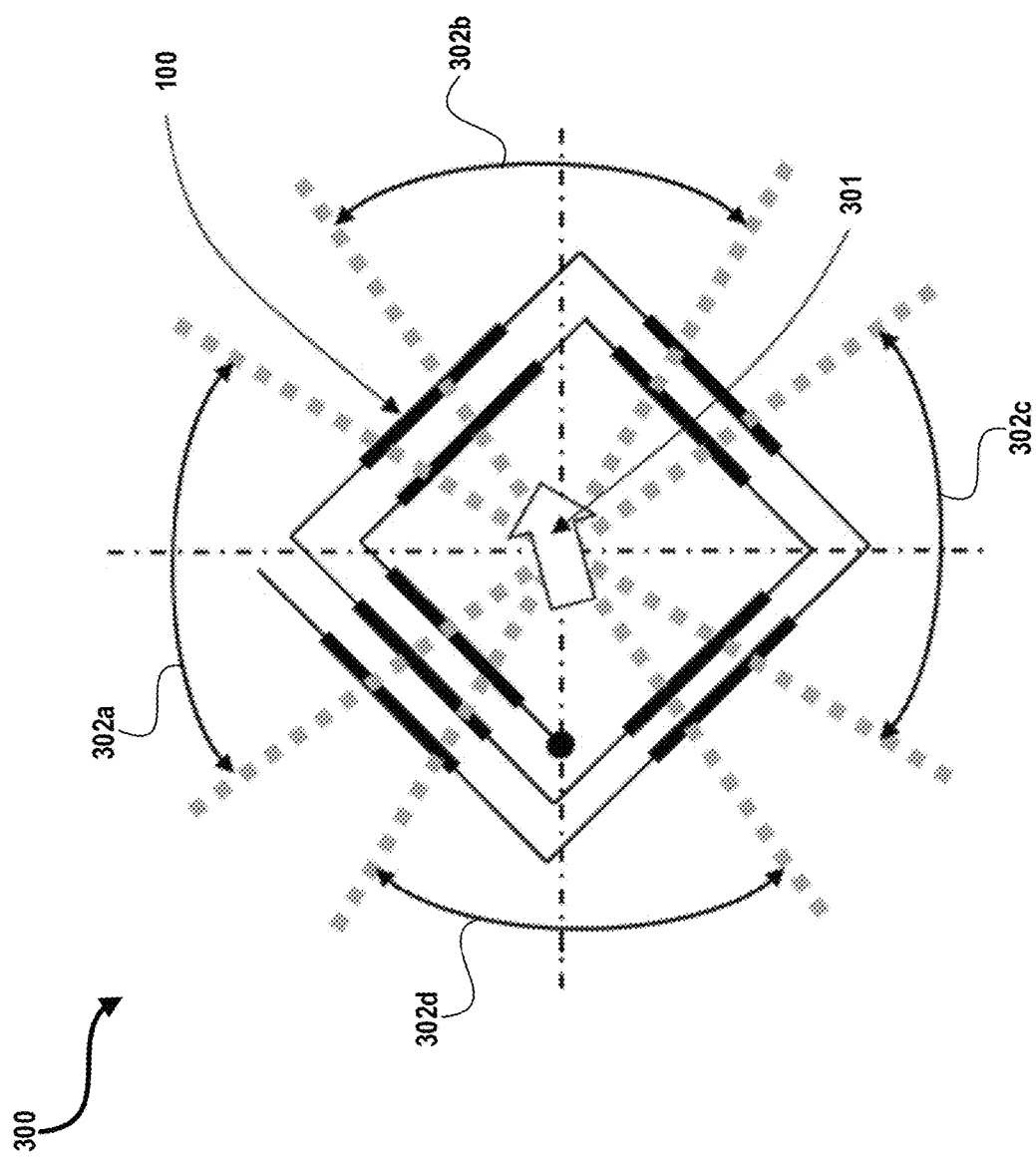
FIG. 3 shows a multi-turn magnetic sensor that can operate with an extended magnetic window.

FIG. 3 shows an example multi-turn magnetic sensor 300 that can be reliably operated with a magnetic target that produces a magnetic field strength at the sensor that is occasionally outside the first magnetic window (e.g., outside a magnetic window in which domain walls predictably propagate through the multi-turn magnetic sensor 300).

The external magnetic field 301 can drop into the second magnetic window (e.g., a magnetic window where propagation of domain walls occurs, but with less than 100% probability) as long as the field direction stays within one of the four areas 302*a*, 302*b*, 302*c*, or 302*d*. In particular, if the direction of the external magnetic field 301 stays within one of the four areas 302*a*, 302*b*, 302*c*, and 302*d*, no domain wall propagation is expected. As such, the less than 100% probability of domain wall propagation within the second magnetic window is acceptable (e.g., since domain wall propagation is not expected within this regions, the reliability of its propagation is irrelevant). Before entering the second magnetic widow, the direction of the external magnetic field 301 should be within one of the four areas the four areas 302*a*, 302*b*, 302*c*, and 302*d* and the direction should remain within the same area as long as the field strength is within the second magnetic window (e.g., between Hmin2 and Hmin).

Various properties of the magnetic windows of the magnetic sensor 300, such as the magnetic field strengths corresponding to a maximum magnetic field strength Hmax, a minimum magnetic field strength for reliable domain wall propagation Hmin, and a minimum magnetic field strength for domain wall propagation Hmin2, may depend upon the geometry of the magnetic sensor 300 as well as the materials forming the magnetic strip. In particular, the thickness and width of the magnetic strip together with the materials forming the strip may serve to define the values of Hmax, Hmin, and Hmin2. Various materials such as iron and cobalt iron may be used to form the magnetic strip. By varying the selected material and/or the thickness and/or width of the magnetic strip, the values of Hmax, Hmin, and Hmin2 can be adjusted. Typical values for the magnetic windows of the sensor 300 in a first implementation may include a maximum magnetic field strength Hmax of approximately 1000 Oersted and a minimum magnetic field strength for reliable domain wall propagation Hmin of approximately 700 Oersted. In a second implementation, the Hmax of sensor 300 may be about 350 Oersted, the Hmin may be about 150 Oersted, and the minimum magnetic field strength for domain wall propagation Hmin2 may be about 50 Oersted. In some instances, the minimum magnetic field strength for reliable domain wall propagation Hmin may be approximately half the value of the maximum magnetic field strength Hmax, while the minimum magnetic field strength for domain wall propagation Hmin2 may be approximately 20 percent of the value of the maximum magnetic field strength Hmax.

The location, size, and even number of the areas 302*a*, 302*b*, 302*c*, and 302*d* in magnetic sensor 300 where the field strength can drop out of the magnetic window may depend at least in part of the physical attributes of the magnetic strip (e.g., spiral) forming the magnetic sensor 300 and may also depend on the materials forming the magnetic strip (which, as discussed herein, may partially determine the properties of the magnetic windows). In some embodiments, the areas 302*a*, 302*b*, 302*c*, and 302*d* may each span roughly 60 degrees, with the gaps between the areas spanning roughly 30 degrees. In some other embodiments, the gaps between the areas 302*a*, 302*b*, 302*c*, and 302*d* may span between 10 and 30 degrees.

Additionally, the external magnetic field 301 can drop from the second magnetic window into the third magnetic window (e.g., a magnetic window below a minimum magnetic field strength for domain wall propagation Hmin2, in which no propagation of domain walls is expected to occur). In the third magnetic window, the direction of the external magnetic field 301 can rotate in any direction without altering the recorded data of sensor 300. However, before the strength of the external magnetic field 301 is adjusted from within the third magnetic window to within the second magnetic window, the magnetic field vector of the external magnetic field 301 should be within one of the four areas 302a, 302b, 302c, and 302d.

In some embodiments, the direction of the external magnetic field 301 should be pointing within the same one of the areas 302a, 302b, 302c, and 302d when its strength rises into the second magnetic window, as it was when its strength dropped out of the second magnetic window. As an example, the magnetic field 301 may, at a first time, be pointing somewhere within area 302a and have a strength in the second magnetic window. Then at a second later time, the magnetic field 301 may drop into the third magnetic window and its direction may change without restriction. Finally at a third later time, the magnetic field 301 may rise back into the second magnetic window, while its direction is within the area 302a.

In some other embodiments, the direction of the external magnetic field 301 may change from one of the areas 302a, 302b, 302c, and 302d to another, while the field strength is within the third magnetic window. In other words, the external magnetic field 301 may drop in strength from the second to the third magnetic window (while in one of areas 302a, 302b, 302c, and 302d); may shift to another one of the areas 302a, 302b, 302c, or 302d; and may then rise in strength from the third to the second magnetic window while in the new area. In such embodiments, there may be a predictable relation between the direction of the magnetic field 301 at the time it entered the third magnetic window and the direction of the magnetic field 301 when it returns to the second magnetic window. The predictable relation may be determined based on the physical layout of the sensor 300 and the rotating magnetic target. As an example, the magnetic field 301 may, at a first time, be pointing somewhere within area 302a, have an initial strength in the second magnetic window, and then drop into the third magnetic window. Then, the direction of the magnetic field 301 may shift in a predictable manner to be pointing within area 302c and, after shifting direction to area 302c, have its strength rise into the second magnetic window. The change from area 302a to 302c, while in the third magnetic window, may be indicative of a turn of the magnetic target in at least some implementations.

Figure 4:
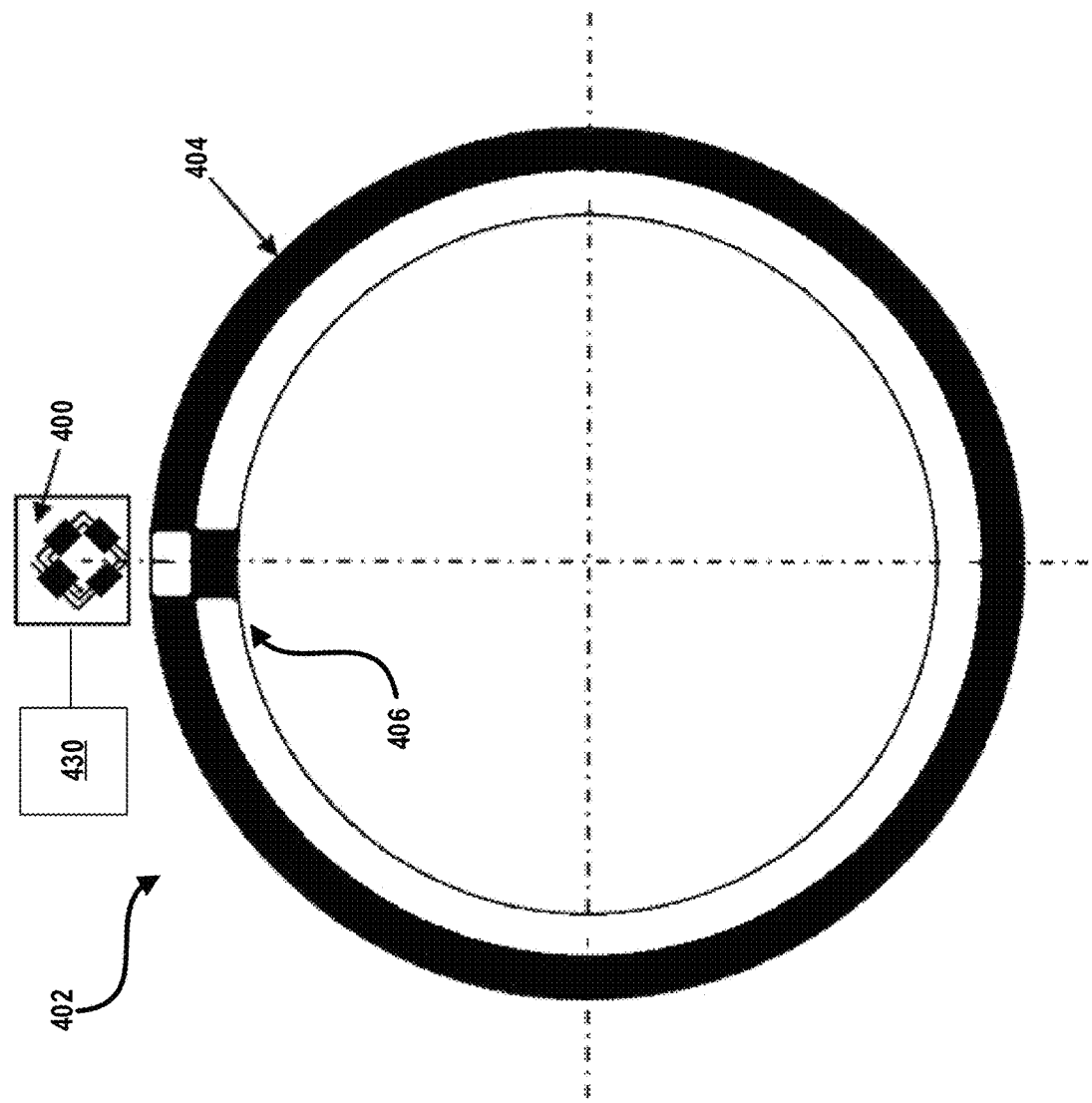
FIG. 4 shows an example of a magnetic target formed from a magnetic ring with a reversed pole pair and of a magnetic sensor sensitive to magnetic fields from the magnetic target according to an embodiment.

FIG. 4 shows an example of a multi-turn magnetic sensing system that includes a multi-turn magnetic sensor 400 and a magnetic target 402 formed from a magnetic ring 404 with a reversed pole pair 406. The magnetic ring 404 along with the reversed pole pair 406 may rotate relative to sensor 400 in concert with a target (e.g., a shaft or other object whose rotation is being tracked by sensor 402). The magnetic ring 404 may be formed from concentric rings, where the outer ring forms a first magnetic pole and the inner ring forms a second magnetic pole. The concentric rings may form a magnetic dipole and the reversed pole pair 406 may form an additional magnetic dipole that is reversed relative to the concentric rings. In at least some embodiments, the magnetic target 402 may be formed from a ring magnetized differently in different areas. Thus, the magnetic target 402 may be a single ring, magnetic in a first direction away from the reversed pole pair 406 and magnetized in a second direction at the reversed pole pair 406.

The multi-turn magnetic sensing system may include readout circuitry, such as readout circuitry 430 as shown in FIG. 4, for reading data from the multi-turn magnetic sensors disclosed herein. The readout circuitry 430 may be provided separate from or integrated with the multi-turn magnetic sensor 400. Readout circuitry, such as readout circuitry 430 of FIG. 4, may sense the position(s) and number of domain walls within the magnetic sensor (e.g., by sensing the resistance of one or more of the tracks that make up the magnetic sensor, whose resistance may vary due to magnetoresistive effects, such as the giant magnetoresistive (GMR), anisotropic magnetoresistive (AMR), tunnel magnetoresistive (TMR), colossal magnetoresistive (CMR), and extraordinary magnetoresistive (EMR) effects). The readout circuitry may analyze the sensed position(s) and number of domain walls and provide an output to an external circuit indicative of the rotation count (or linear position in embodiments utilizing targets that translate linearly) of the magnetic target.

The magnetic target 402 may induce a magnetic field at sensor 400 that varies with rotation of the magnetic target 402 relative to the magnetic sensor 400, thus enabling sensor 400 to track rotation or a rotation count of the magnetic target 402. As an example, there may be a reversed pole pair such as pole pair 406 at one or more locations along the magnetic ring 404, where the positions of the magnetic poles are reversed relative to the magnetic ring 404. As an example, the shaded regions of FIG. 4 may represent magnetic north poles, while the unshaded regions may represent magnetic south poles, or vice-versa. Because of the reversed pole pair 406, the magnetic ring 404 may generate a non-uniform magnetic field that can be used to keep track of the rotations of the magnetic ring 404. If desired, structures other than reversed pole pair 406 may be included as part of magnetic ring 404 in order to induce a non-uniform magnetic field and enable tracking of the rotation and/or rotation count of magnetic ring 404.

In the multi-turn magnetic sensing system of FIG. 4, the sensor 400 can count a number of turns with a full turn resolution. The sensor 400 can store a state corresponding to an accumulated number of turns, in which the accumulated number of turns can be greater than 1.

In at least some embodiments, the field strength of magnetic target 402 is high near the reversed pole pair 406, but weak along other portions of the magnetic ring 404. In other words, whenever rotation of the magnetic ring 404 moves the reversed pole pair 406 away from sensor 400, the field strength received by sensor 400 may be low. In contrast, whenever rotation of the ring 404 moves the reversed pole pair 406 near sensor 400, the field strength received by sensor 400 may be high.

In the example of FIG. 4, the south magnetic pole of magnetic rings 404 may be radial to the plane of the magnetic target 402 (e.g., be pointed inwards to the center of the ring), while the north magnetic pole of magnetic rings 404 may be anti-radial to the plane of the magnetic target 402 (e.g., be pointed inwards to the center of the ring), or vice-versa (e.g., the north and south poles may be swapped). Similarly, the north and south magnetic poles of the reversed pole pair 406 may be said to be radial and anti-radial (or vice-versa) to the plane of the magnetic target 402.

Figure 5A:
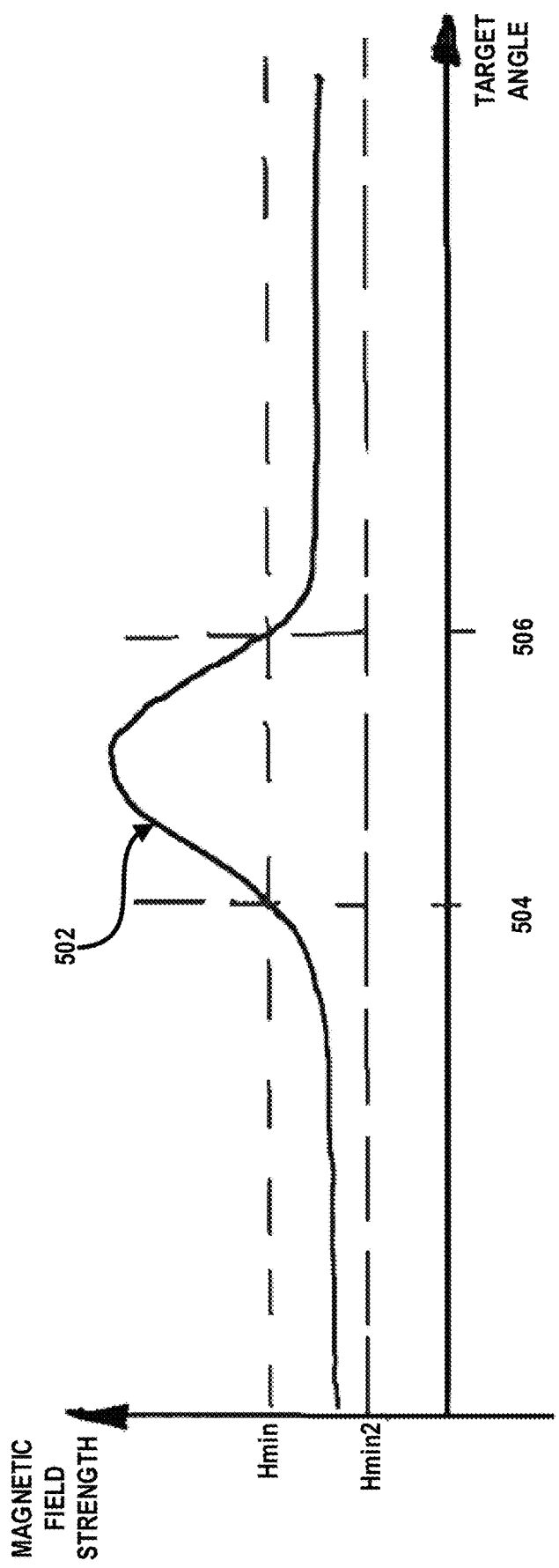
FIG. 5A shows a graph of magnetic field strength at the multi-turn magnetic sensor of FIG. 4 as a function of the rotation angle of the magnetic target of FIG. 4.
Figure 5B:
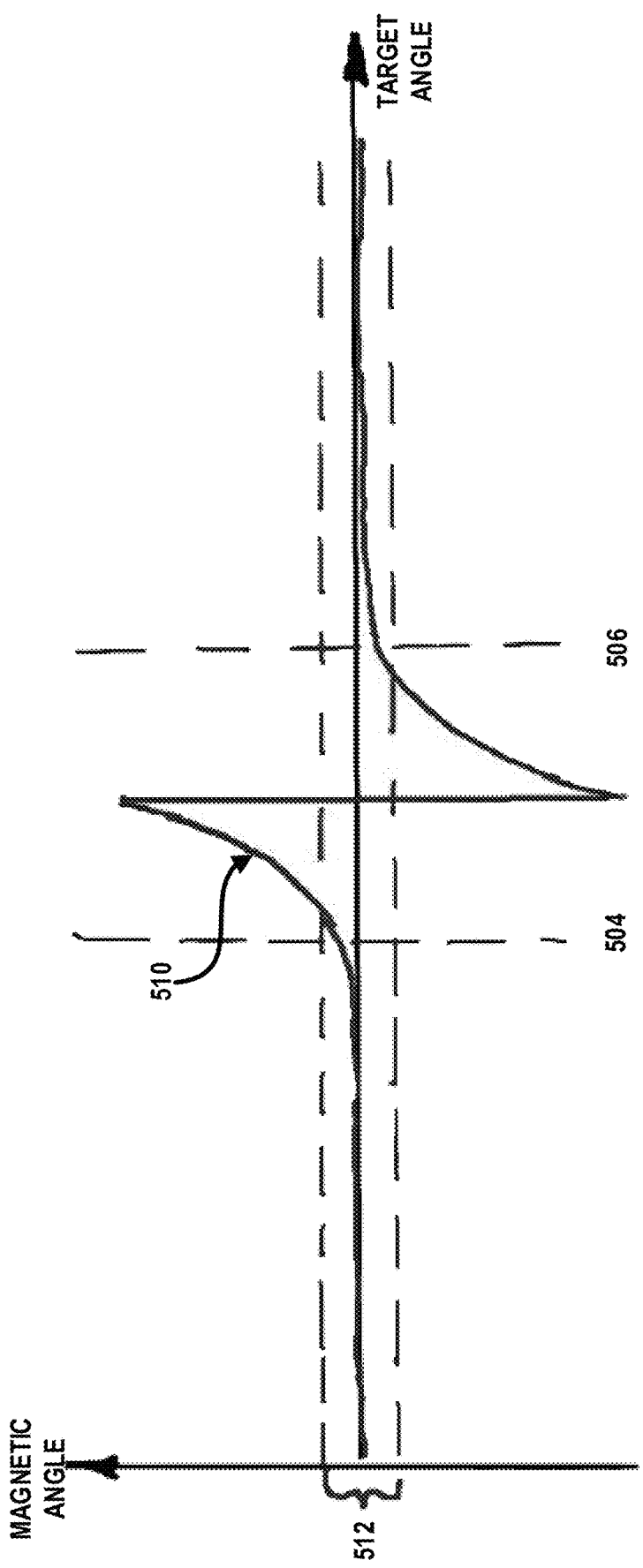
FIG. 5B shows a graph of magnetic field direction at the multi-turn magnetic sensor of FIG. 4 as a function of the rotation angle of the magnetic target of FIG. 4.

Graphs that include a magnetic field strength curve 502 and magnetic field angle curve 510 (e.g., magnetic angle) induced by magnetic target 402 of FIG. 4 at magnetic sensor 400 are shown in FIGS. 5A and 5B, respectively. FIGS. 5A and 5B respectively show the field strength and angle as a function of the rotation angle of the magnetic target 402 relative to the magnetic sensor 400.

As shown in FIG. 5A, magnetic field strength may be above a minimum magnetic field strength for reliable domain wall propagation Hmin and in the magnetic window of magnetic sensor 400 between angles 504 and 506. The peak of the magnetic field strength curve 502, which occurs roughly at the midpoint between angles 504 and 506, may generally correspond to the position of the reversed pole pair 406 of the magnetic target 402 being in proximity to the magnetic sensor 400. In particular, the magnetic field strength curve 502 may generally be at its maximum when the magnetic target 402 is rotated such that the reversed pole pair 406 is adjacent to the magnetic sensor 400, which may be the position illustrated in FIG. 4. As the magnetic target 402 is rotated such that the reversed pole pair 406 moves away from the magnetic sensor 400, the magnetic field strength curve 502 may decrease and drop below the minimum magnetic field strength for reliable domain wall propagation Hmin into the second magnetic window, in which propagation of domain walls with changing magnetic field direction is expected to occur, but with less than 100% probability.

As shown in FIG. 5B and in at least some embodiments, the magnetic field direction may lie within a range of angles 512, whenever target 402 is rotated below angle 504 or above angle 506. The range of angles 512 may correspond to one of the four areas 302a, 302b, 302c, and 302d illustrated in FIG. 3. In particular, the magnetic field produced by magnetic target 402 may be within one of the four areas 302a, 302b, 302c, or 302d when the magnetic target 402 is rotated to an angle below angle 504 or above angle 506. As discussed in connection with FIG. 3, no propagation of domain walls is expected while the magnetic angle remains within one of the four areas 302a, 302b, 302c, and 302d. Thus, while the magnetic target is at an angle below 504 or above angle 506, the magnetic field strength may drop below the minimum magnetic field strength for reliable domain wall propagation Hmin into the second magnetic window and may even drop below the minimum magnetic field strength for domain wall propagation Hmin2 into the third magnetic window, without loss of data.

As the magnetic target 402 rotates and the reversed pole pair 406 passes by the sensor 400, the magnetic field strength is within the magnetic window and completes a full 360 degree rotation as illustrated in FIG. 5B. The rotation in the magnetic field direction can be recorded by sensor 400 and used to track a rotation count of the magnetic target 402.

As shown in FIGS. 5A and 5B, the magnetic field strength may be above the minimum magnetic field strength for reliable domain wall propagation Hmin and in the magnetic window of magnetic sensor 400 at all times that the magnetic field angle curve 510 is outside of the range of angles 512. Thus, the magnetic target 402 may provide a magnetic field strength sufficient to cause reliable propagation of domain walls within magnetic sensor 400 whenever the direction of the magnetic field is substantially changing due to rotation of the magnetic target 402.

In at least some embodiments, the magnetic sensors disclosed herein, such as magnetic sensors 400, 600, 800, and 900, may be preloaded and/or initialized with one or more domain walls prior to active operations in tracking the rotations of a magnetic target. As an example, magnetic fields from a source other than the magnetic target (e.g., a magnetic initialization source) may be applied to a magnetic sensor in order to generate one or more domain walls, such as domain wall 213 of FIG. 2, and to position those domain walls at suitable locations along the track. This initialization process may be beneficial in arrangements in which the rotation of a magnetic target is capable of moving a domain wall within a magnetic sensor, but unable to generate new domain walls.

Figure 6:
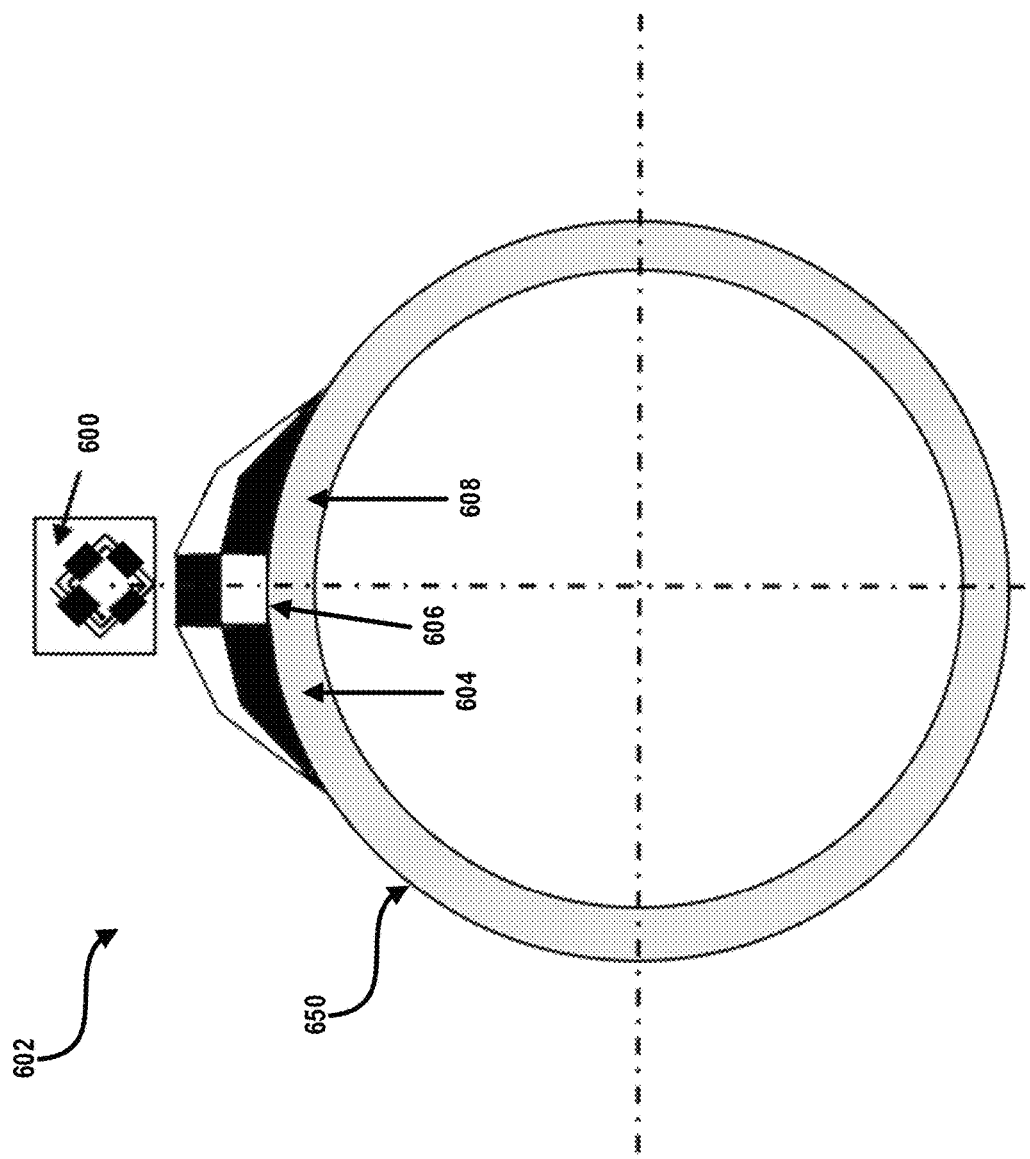
FIG. 6 shows an example of a magnetic target formed from a ring with magnetic poles and of a magnetic sensor sensitive to magnetic fields from the magnetic target according to an embodiment.

FIG. 6 shows an alternative magnetic target 602 that can be tracked by a magnetic sensor such as sensor 600. The magnetic target 602 may include three magnetic pole pairs 604, 606, and 608, which may have alternating poles. In particular, magnetic pole pair 606 may be reversed relative to pole pairs 604 and 608. Additionally, magnetic pole pairs 604 and 608 may be configured such that the magnetic field strength drops off, potentially to zero, with increasing distance from the middle pole pair 606. The magnetic pole pairs 604 and 608 may be formed from magnetic materials that taper off in thickness, with the thickest regions adjacent to reversed pole pair 606 and a tapering thickness with increasing distance from the reversed pole pair 606. In at least some embodiments, magnetic targets such as target 602 and the other targets disclosed herein may be formed from a single piece of magnetic material, with different regions having different magnetizations. As an example, regions of the single piece of magnetic material corresponding to the middle pole pair 606 may be magnetized in a first direction, while regions of the single piece of magnetic material corresponding to the pole pairs 604 and 608 may be magnetized in a second direction. In still other embodiments, magnetic targets such as target 602 and the other targets disclosed herein may be formed from multiple pieces of magnetic material joined together.

In contrast with the magnetic target 402 of FIG. 4, the magnetic target 602 may include substantially less magnetic material. In particular, the magnetic target 602 may be formed substantially from magnetic material forming the magnetic pole pairs 604, 606, and 608 integrated into, attached to, or otherwise disposed at one or more locations along target 650. In at least some embodiments, the magnetic target 602 may be formed by attaching magnetic material forming the magnetic pole pairs 604, 606, and 608 onto a target 650, in order to count rotations of the target 650. The target 650 may be non-magnetic, if desired. A magnetic target 602 may also be provided in a linear shape with one or more groupings of two or three magnetic pole pairs spaced along the elongate direction of the linear target.

In the example of FIG. 6, the north magnetic pole of magnetic pole pairs 604 and 608 may be said to be radial to the plane of the magnetic target 602 (e.g., be pointed inwards to the center of the ring), while the south magnetic pole of magnetic pole pairs 604 and 608 may be said to be anti-radial to the plane of the magnetic target 602 (e.g., be pointed outwards from the ring), or vice-versa (e.g., the north and south poles may be swapped). Similarly, the north and south magnetic poles of the reversed pole pair 606 may be said to be respectively anti-radial and radial (or vice-versa) to the plane of the magnetic target 602.

Figure 7A:
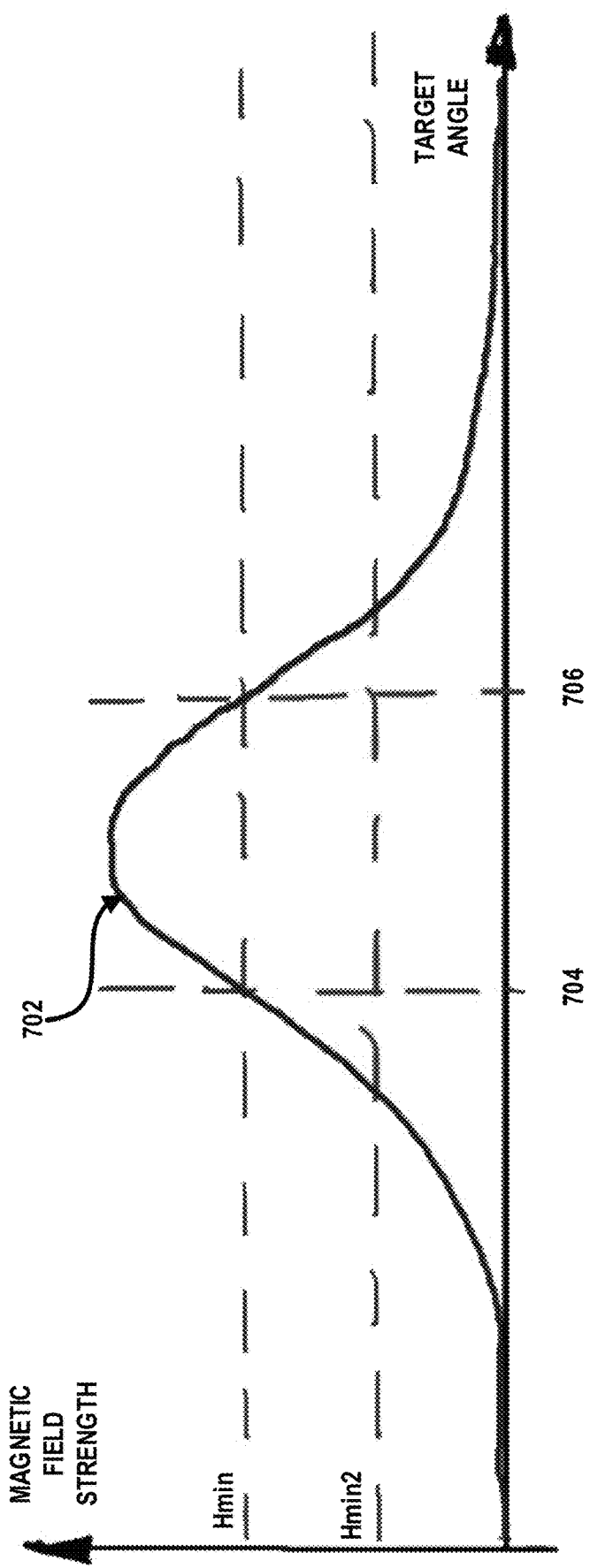
FIG. 7A shows a graph of magnetic field strength at the multi-turn magnetic sensor of FIG. 6 as a function of the rotation angle of the magnetic target of FIG. 6.
Figure 7B:
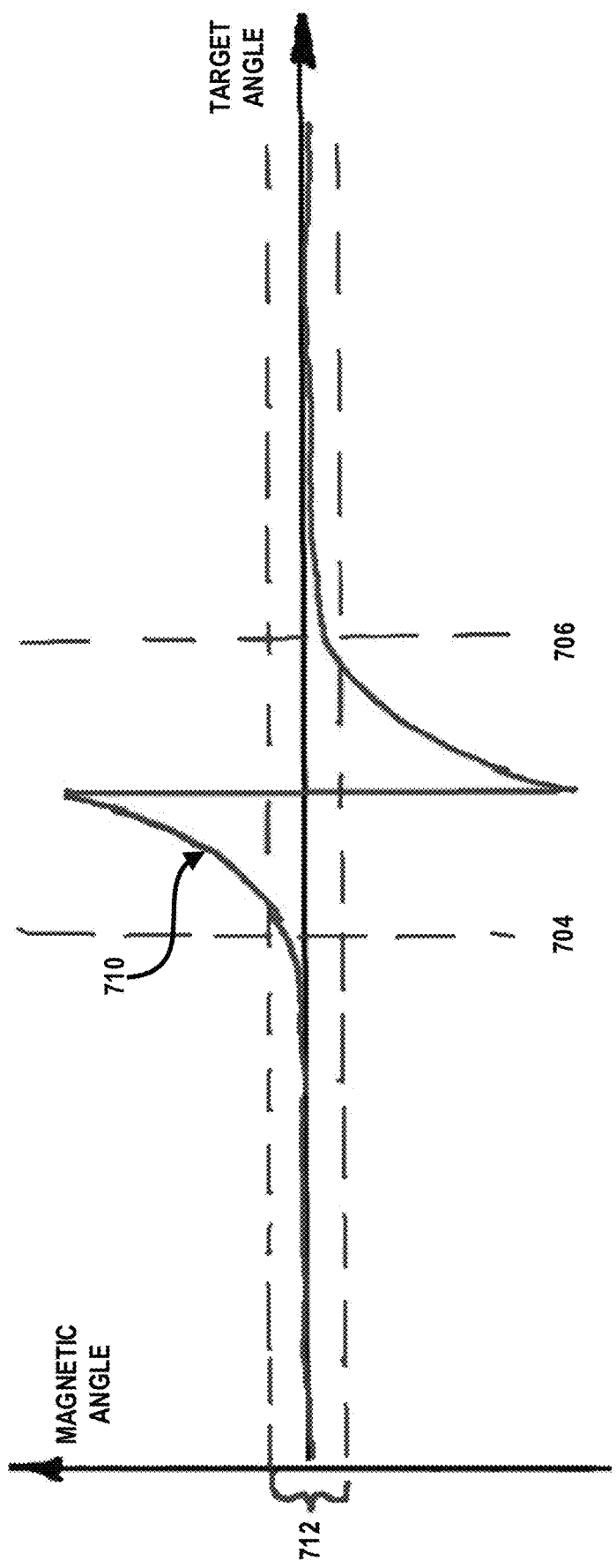
FIG. 7B shows a graph of magnetic field direction at the multi-turn magnetic sensor of FIG. 6 as a function of the rotation angle of the magnetic target of FIG. 6.

Graphs of the magnetic field strength curve 702 and magnetic field angle curve 710 (e.g., magnetic angle) induced by magnetic target 602 of FIG. 6 at magnetic sensor 600 are shown in FIGS. 7A and 7B, respectively. FIGS. 7A and 7B respectively show the field strength and angle as a function of the rotation angle of the magnetic target 602 relative to the magnetic sensor 600.

As shown in FIG. 7A, magnetic field strength may be above the minimum magnetic field strength for reliable domain wall propagation Hmin and in the magnetic window of magnetic sensor 600 between angles 704 and 706. The peak of the magnetic field strength curve 702, which occurs roughly at the midpoint between angles 704 and 706, may generally correspond to the position of the reversed pole pair 606 of the magnetic target 602. In particular, the magnetic field strength curve 702 may generally be at its maximum when the magnetic target 602 is rotated such that the reversed pole pair 606 is adjacent to the magnetic sensor 600, which may be the position illustrated in FIG. 6. As the magnetic target 602 is rotated such that the reversed pole pair 606 moves away from the magnetic sensor 600, the magnetic field strength curve 702 may decrease and drop below the minimum magnetic field strength for reliable domain wall propagation Hmin into the second magnetic window, in which propagation of domain walls with changing magnetic field direction is expected to occur, but with less than 100% probability. As the magnetic target 602 is further rotated such that the pole pairs 604 and 608 move away from the magnetic sensor 600, the magnetic field strength curve 702 may further decrease and drop below the minimum magnetic field strength for domain wall propagation Hmin2 into the third magnetic window, in which no propagation of domain walls is expected to occur.

As shown in FIG. 7B and in at least some embodiments, the magnetic field direction may lie within a range of angles 712, whenever target 602 is rotated below angle 704 or above angle 706. The range of angles 712 may correspond to one of the four areas 302a, 302b, 302c, and 302d illustrated in FIG. 3. In particular, the magnetic field produced by magnetic target 602 may be within one of the four areas 302a, 302b, 302c, or 302d when the magnetic target is rotated to an angle below angle 704 or above angle 706 relative to the magnetic sensor 600. As discussed in connection with FIG. 3, no propagation of domain walls is expected while the magnetic angle remains within one of the four areas 302a, 302b, 302c, and 302d. Thus, while the magnetic target 602 is at an angle below 704 or above angle 706, the magnetic field strength curve 702 may drop below the minimum magnetic field strength for reliable domain wall propagation Hmin into the second magnetic window and may drop below the minimum magnetic field strength for domain wall propagation Hmin2 into the third magnetic window, without loss of data. It should be noted that while the magnetic field strength is in the third magnetic window, the direction of the magnetic field is irrelevant. Thus, stray magnetic fields or other changes in the magnetic field direction do not impact the operation of magnetic sensor 600 as long as the strength remains within the third magnetic window.

As the magnetic target 602 rotates and the reversed pole pair 606 passes by the sensor 600, the magnetic field strength is within the magnetic window and completes a full 360 degree rotation as illustrated in FIG. 7B. The rotation in the magnetic field direction can be recorded by sensor 600 and used to track a rotation count of the magnetic target 602.

As shown in FIGS. 7A and 7B, the magnetic field strength may be above the minimum magnetic field strength for reliable domain wall propagation Hmin and in the magnetic window of magnetic sensor 600 at all times that the magnetic field direction is outside of the range of angles 712. Thus, the magnetic target 602 may provide a magnetic field strength sufficient to cause reliable propagation of domain walls within magnetic sensor 600 whenever the direction of the magnetic field is substantially changing due to rotation of the magnetic target 602 relative to the sensor 600.

If desired, the principles and advantages discussed herein may be applied to targets of different shapes. As an example, linear magnetic targets, such as the targets illustrated in the examples of FIGS. 12 and 13, may be provided instead of circular magnetic targets. In a linear application, a magnetic bar may be magnetized perpendicular to its elongate direction and may have one or more reversed poles disposed along its elongate direction. A multi-turn magnetic sensor can count the reversed poles (in a manner similar to that discussed herein in connection with circular targets) and thereby track linear movement of the magnetic target relative to the magnetic sensor. Alternatively or additionally, a multi-turn magnetic sensor can be arranged to rotate relative to a linear magnetic target and count turns of rotation of the multi-turn magnetic sensor.

Figure 8:
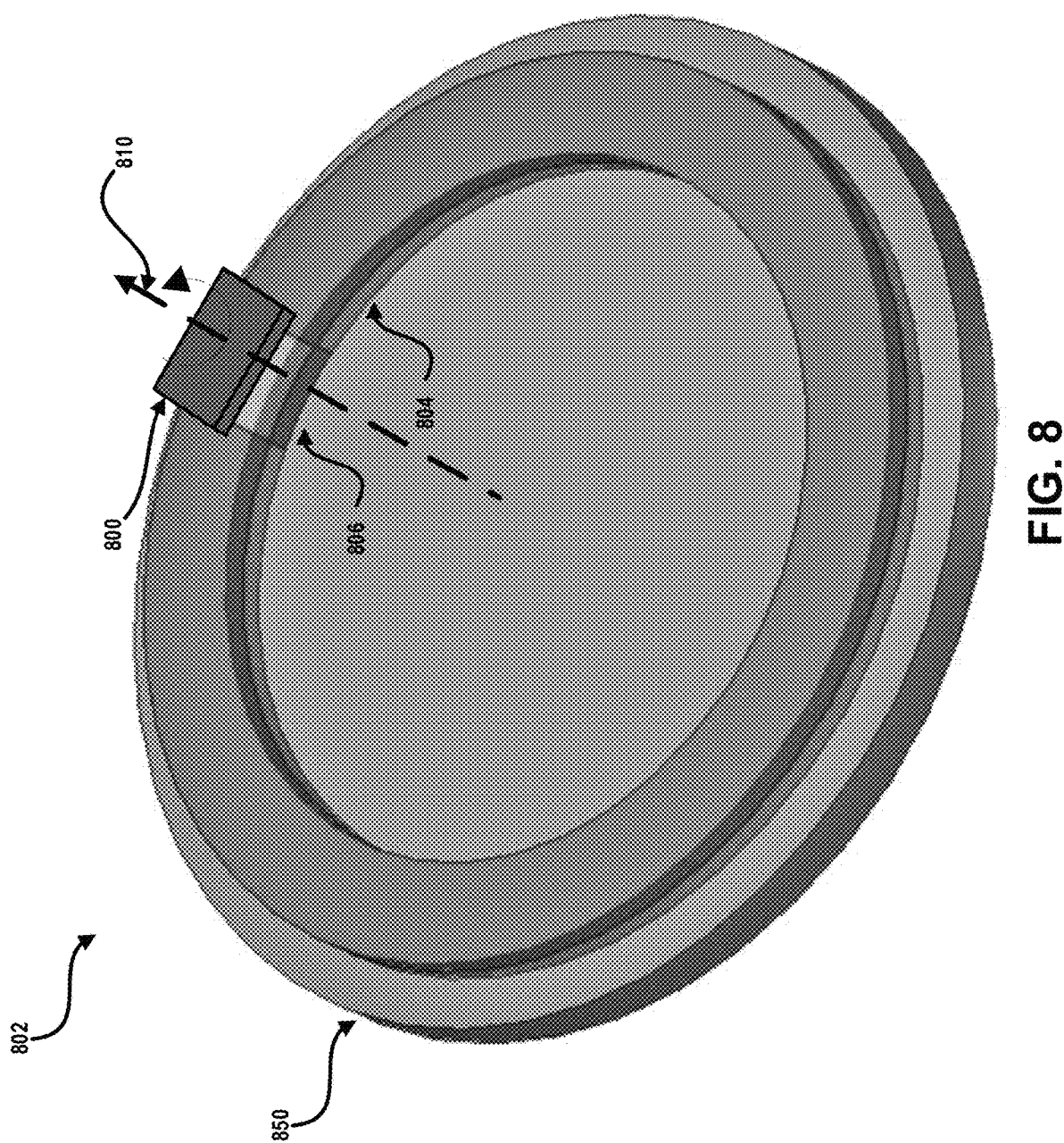
FIG. 8 shows an example of a magnetic target formed from a magnetic ring with a reversed pole pair and configured for axial sensing by a multi-turn magnetic sensor according to an embodiment.
Figure 9:
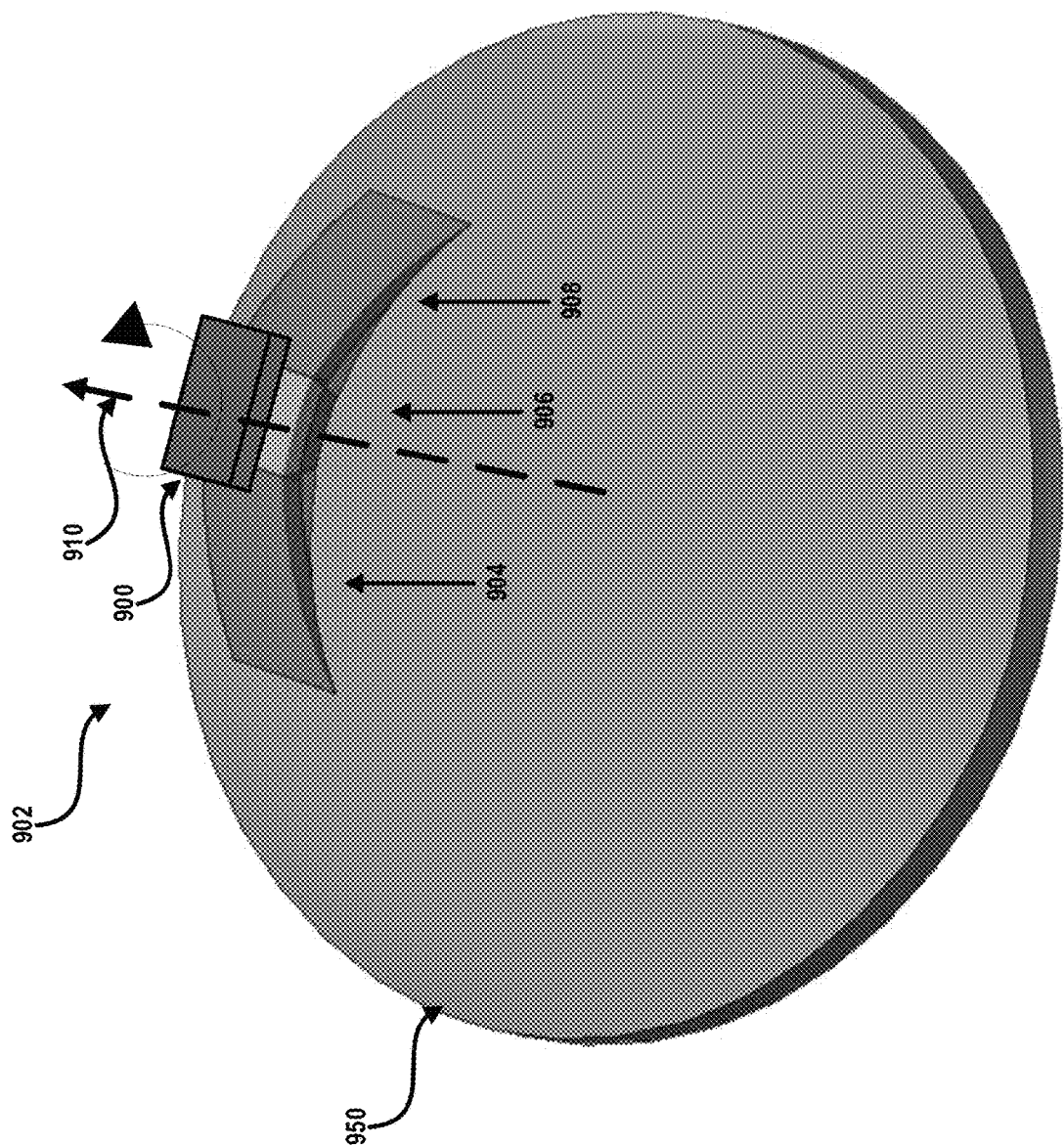
FIG. 9 shows an example of a magnetic target formed from a ring with magnetic poles and configured for axial sensing by a multi-turn magnetic sensor according to an embodiment.

As another example, the principles and advantages discussed herein may be applied to magnetic rings configured for axial sensing, as shown in the examples of FIGS. 8 and 9.

As shown in the example of FIG. 8, a magnetic target 802 may be configured for sensing by a magnetic sensor, such as sensor 800, disposed above the plane of the magnetic target 802. The magnetic target 802 may include magnetic rings 804 and a reversed pole pair 804 integrated into, attached to, or otherwise disposed on target 850. The magnetic rings 804 may be magnetized as shown in FIG. 8, where the magnetic poles are disposed on opposite faces of the ring, as opposed to the concentric arrangement of FIG. 4. The magnetic target 802 may rotate around axis of rotation 810, in concert with target 850, and the number of rotations of the magnetic target 802, and hence of target 850, may be recorded by magnetic sensor 800 using the techniques discussed herein.

In the example of FIG. 8, the north magnetic pole of magnetic rings 804 may be normal to the plane of the magnetic target 802 (e.g., be pointed above the plane of the ring), while the south magnetic pole of magnetic rings 804 may be anti-normal to the plane of the magnetic target 802 (e.g., be pointed below the plane of the ring), or vice-versa (e.g., the north and south poles may be swapped). Similarly, the north and south magnetic poles of the reversed pole pair 806 may be said to be anti-normal and normal (or vice-versa) to the plane of the magnetic target 802.

The magnetic target 802 of FIG. 8 can produce magnetic fields for magnetic sensor 800, which can be any of the multi-turn magnetic sensors discussed above, that are similar to the magnetic fields of the magnetic target 402 of FIG. 4. In particular, the strength of the magnetic field produced by magnetic target 802 may be within the second or third magnetic window when the magnetic target 802 is rotated such that the reversed pole pair 806 is disposed away from the magnetic sensor 800. Additionally, when the magnetic target 802 is rotated such that the reversed pole pair 806 passes by the magnetic sensor 800, the magnetic field produced by magnetic target 802 may have a strength within the magnetic window of sensor 800 and may change direction in a manner that can be recorded by sensor 800, thereby enabling sensor 800 to keep track of the rotation count of the magnetic target 802.

As shown in the example of FIG. 9, a magnetic target 902 configured for axial sensing by magnetic sensor 900 may be formed from pole pairs 904 and 908 disposed on either side of reversed pole pair 906. The pole pairs 904, 906, and 908 may be integrated into, attached to, or otherwise disposed at one or more locations along target 950. The magnetic target 902 may rotate around axis of rotation 910, in concert with target 950, and the number of rotations of the magnetic target 902, and hence of target 950, may be recorded by magnetic sensor 900 using the techniques discussed herein. The magnetic target 902 may have benefits similar to those discussed herein in connection with FIG. 6.

The magnetic target 902 of FIG. 9 may produce magnetic fields for magnet sensor 900 that are similar to the magnetic fields of the magnetic target 602 of FIG. 6. In particular, the strength of the magnetic field produced by magnetic target 902 may be within the third magnetic window when the magnetic target 902 is rotated such that the reversed pole pair 906 is disposed away from the magnetic sensor 900. Additionally, when the magnetic target 902 is rotated such that the reversed pole pair 906 passes by the magnetic sensor 900, the magnetic field produced by magnetic target 902 may have a strength within the magnetic window of sensor 900 and may change direction in a manner that can be recorded by sensor 900, thereby enabling sensor 900 to keep track of the rotation count of the magnetic target 902.

In the example of FIG. 9, the north magnetic poles of magnetic pole pairs 904 and 908 may be normal to the plane of the magnetic target 902 (e.g., be pointed above the plane of the ring), while the south magnetic poles of pairs 904 and 908 may be anti-normal to the plane of the magnetic target 902 (e.g., be pointed below the plane of the ring), or vice-versa (e.g., the north and south poles may be swapped). Similarly, the north and south magnetic poles of the reversed pole pair 906 may be said to be anti-normal and normal (or vice-versa) to the plane of the magnetic target 902.

Figure 10:
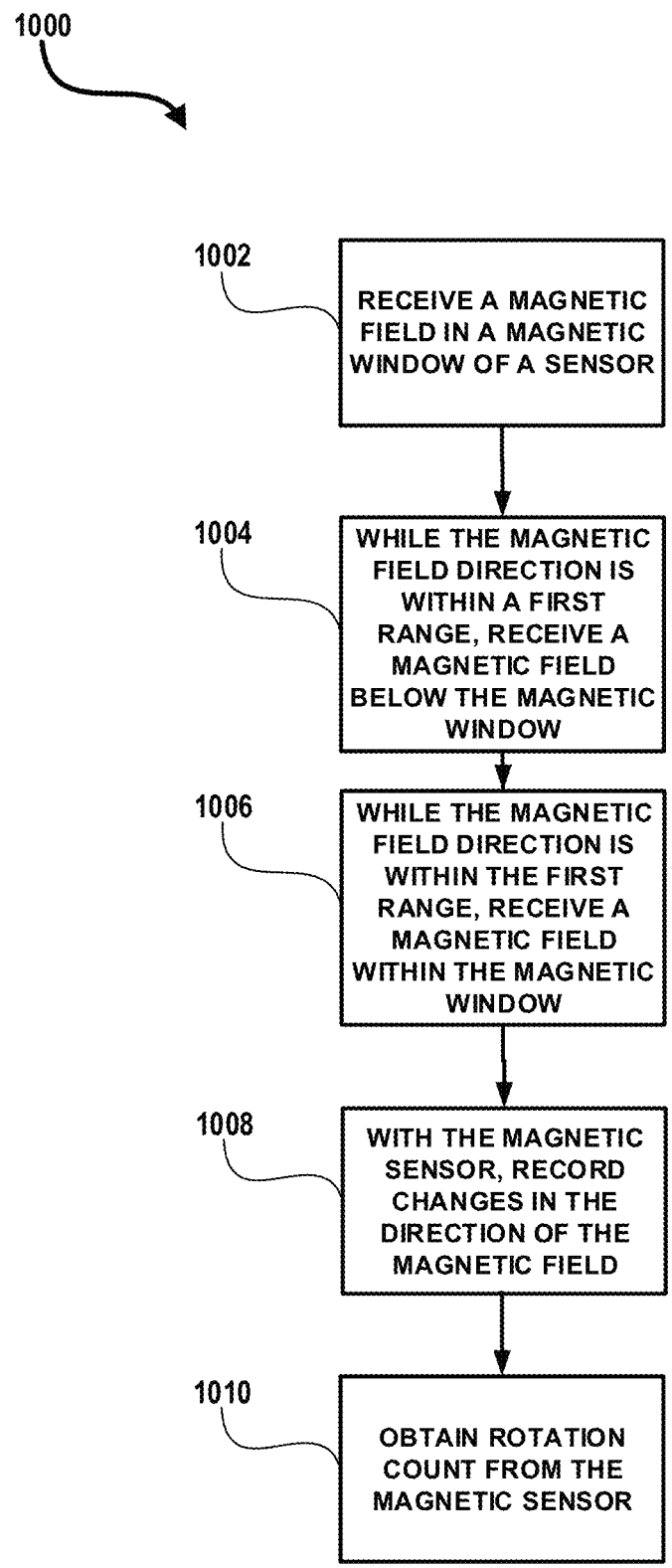
FIG. 10 is a flow diagram of an example method for counting turns of a magnetic target according to an embodiment.

FIG. 10 shows an example method 1000 for counting turns of a magnetic target with a magnetic sensor. The magnetic target and sensor may be any of the magnetic targets and sensors disclosed herein.

At block 1002, a magnetic sensor may receive a magnetic field having a strength that is within a first magnetic window of the sensor. As an example, the magnetic field may be generated by a magnetic target that rotates (or otherwise moves) relative to the magnetic sensor. The magnetic field may have a strength sufficient to cause reliable propagation of domain walls with the magnetic sensor (e.g., be no smaller than the minimum magnetic field strength for reliable domain wall propagation Hmin), but not so strong as to create or nucleate new domain walls within the magnetic sensor without corresponding rotation of the magnetic field (e.g., be no larger than the maximum magnetic field strength Hmax).

At block 1004, the magnetic sensor may receive a magnetic field having a strength below the magnetic window of the sensor (e.g., a field of less than the minimum magnetic field strength for reliable domain wall propagation Hmin). Additionally, the magnetic field may have a direction at block 1004 that is not associated with propagation of domain walls. As an example, the direction of the magnetic field may be within one of the areas 302a, 302b, 302c, or 302d of FIG. 3. In at least some embodiments, block 1004 may involve the magnetic field strength dropping below the second magnetic window such that no propagation of domain walls is expected (e.g., a field of less than the minimum magnetic field strength for domain wall propagation Hmin2). In such embodiments, the direction of the magnetic field may be irrelevant and unrestricted while the field strength is below the minimum magnetic field strength for domain wall propagation Hmin2.

At block 1006, the magnetic sensor may receive a magnetic field having a strength within the magnetic window of the sensor. Additionally, the magnetic field may have a direction at block 1006 that is not associated with propagation of domain walls, such as one of the areas 302a, 302b, 302c, or 302d of FIG. 3.

At block 1008 and while the magnetic field is within the magnetic window, the magnetic sensor may track or record changes in the direction of the magnetic field produced by a magnetic target. In particular, the magnetic sensor may produce, erase, or move domain walls within a spiral track. The position(s) and number of domain walls may be used to keep track of changes in the direction of the magnetic field produced by the magnetic target.

At block 1010, the magnetic sensor may be read out to obtain a rotation count of the magnetic target. In particular, readout circuitry coupled to the magnetic sensor may sense the position(s) and number of domain walls within the magnetic sensor (e.g., by sensing the resistance of one or more of the tracks that make up the magnetic sensor, whose resistance may vary due to the GMR effect). The magnetic sensor may keep track of how many times the magnetic target was turned relative to the sensor. The magnetic sensor may be able to add counts when the magnetic target rotates in a first direction and subtract counts when the magnetic target rotates in a second direction opposite the first. Thus, in block 1010, the readout circuitry may determine how many times and in what direction the magnetic target has been rotated relative to some baseline state. Such information may be used, as an example, to determine if a car's steering wheel is straight, rotated 360 degrees clockwise, or rotated 360 degrees counter-clockwise.

In at least some embodiments, the magnetic sensors disclosed herein such as magnetic sensors 400, 600, 800, and 900 may be preloaded or initialized with one or more domain walls prior to use in tracking the rotations of a magnetic target. As an example, magnetic fields from a source other than the magnetic target (e.g., an initialization magnet) may be applied to a magnetic sensor in order to generate one or more domain walls, such as domain wall 213 of FIG. 2, and to position those domain walls at suitable locations along the track. This initialization process may be beneficial in arrangements in which the rotation of a magnetic target is capable of moving a domain wall within a magnetic sensor, but where it is difficult for the magnetic target to generate new domain walls.

Figure 11:
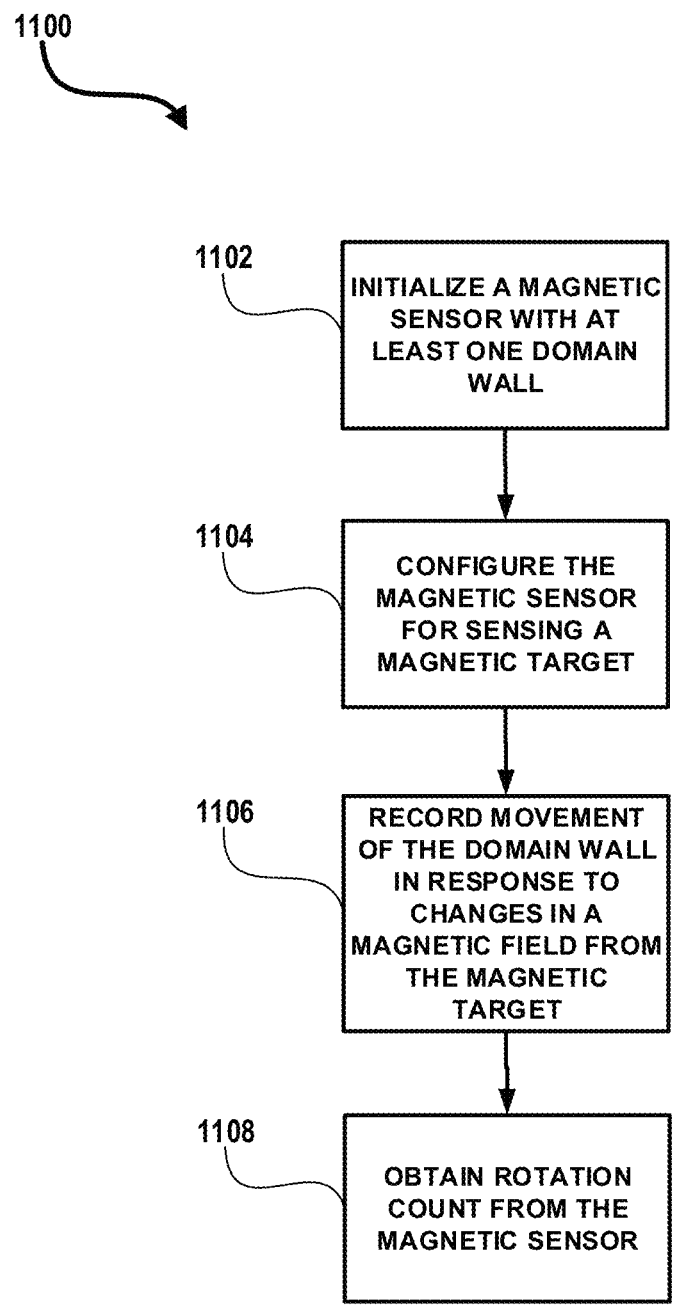
FIG. 11 is a flow diagram of an example method for initializing a magnetic sensor with one or more domain walls according to an embodiment.

FIG. 11 shows an example method 1100 for initializing a magnetic sensor with one or more domain walls. The magnetic target and sensor referred to in FIG. 11 may be any of the magnetic targets and sensors disclosed herein.

At block 1102, one or more magnetic sensors may be initialized to have at least one domain wall. As an example, a magnetic field from an initialization source (e.g., a source other than the magnetic target the sensor will eventually track) may be applied to the magnetic sensor in a manner that generates one or domain walls within the magnetic spiral of the sensor. The initialization process of block 1102 may involve applying an initializing magnetic field at a strength within the magnetic window of the sensor, then rotating the magnetic field through a partial revolution, a whole revolution, or more than one whole revolution.

At block 1104, the magnetic sensor may be configured to sensing a magnetic target. As an example, the magnetic sensor may be installed in a device near a magnetic target, such that rotation (or linear movement) of the magnetic target can be tracked by the magnetic sensor.

At block 1106, movement of one of more domain walls, which may include the domain wall(s) generated in block 1102, may be recorded by the magnetic sensor in response to rotation of the magnetic target and corresponding changes in the magnetic field generated by the magnetic target and received by the magnetic sensor.

At block 1108, the magnetic sensor may be read out to obtain a rotation count of the magnetic target. In particular, readout circuitry coupled to the magnetic sensor may sense the position(s) and number of domain walls within the magnetic sensor (e.g., by sensing the resistance of one or more of the tracks that make up the magnetic sensor, whose resistance may vary due to the GMR effect). The magnetic sensor may keep track of how many times the magnetic target was turned relative to the sensor. The magnetic sensor may be able to add counts when the magnetic target rotates in a first direction and subtract counts when the magnetic target rotates in a second direction opposite the first. Thus, in block 1108, the readout circuitry may determine how many times and in what direction the magnetic target has been rotated relative to some baseline state. Such information may be used, as an example, to determine if a car's steering wheel is straight, rotated 360 degrees clockwise, or rotated 360 degrees counter-clockwise.

Figure 12:
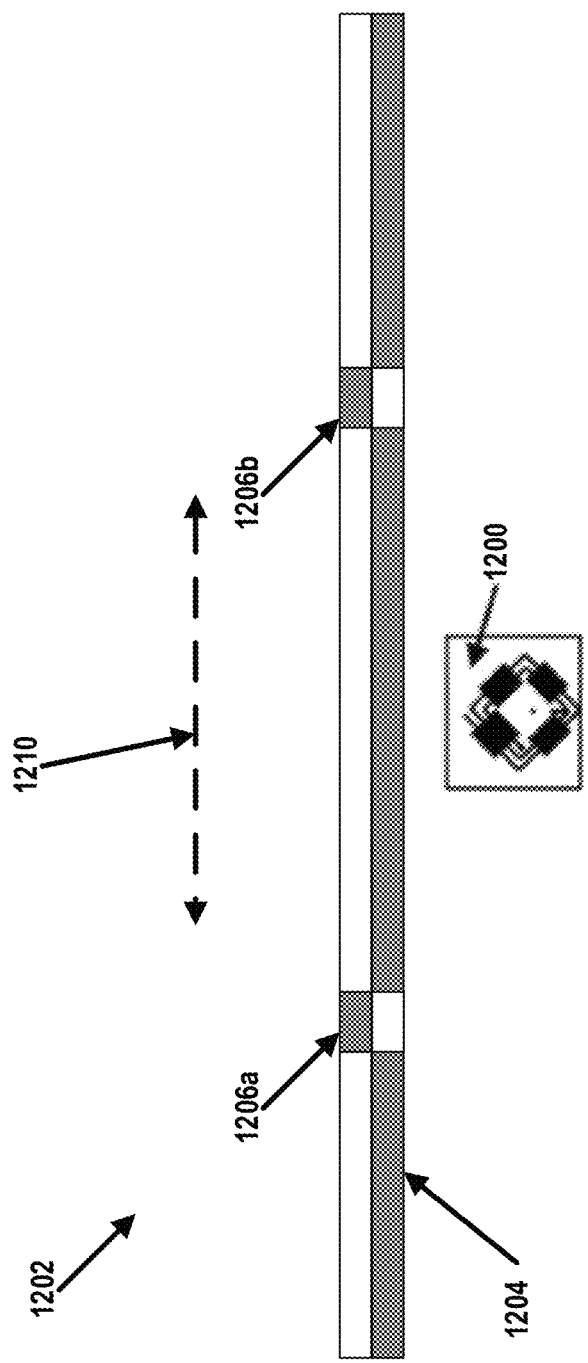
FIG. 12 shows an example of a linear magnetic target formed from a magnetic bar with at least one reversed pole pair according to an embodiment.
Figure 13:
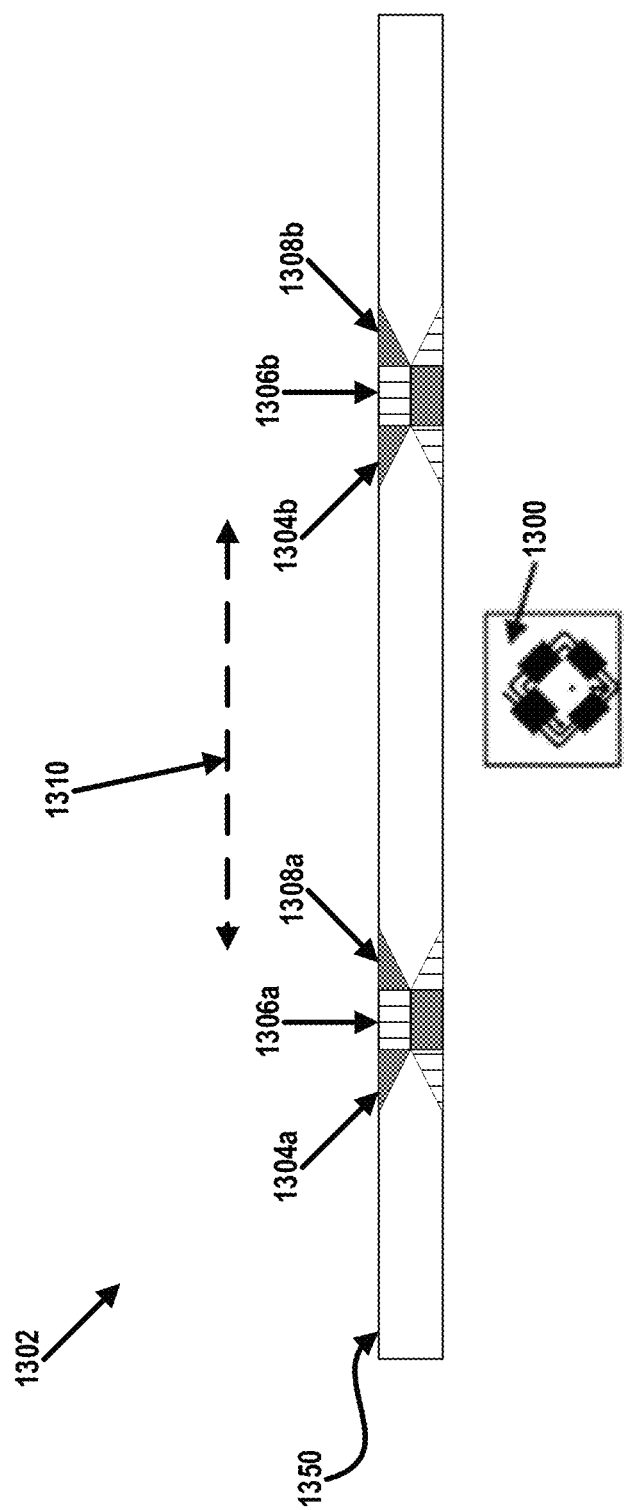
FIG. 13 shows an example of a linear magnetic target formed from a linear target with magnetic pole pairs according to an embodiment.

As discussed herein, the principles and advantages discussed herein may be applied to targets of different shapes including linear targets, such as the linear targets illustrated in the examples of FIGS. 12 and 13.

FIG. 12 shows an alternative magnetic target 1202 that can be tracked by magnetic sensor 1200. As shown in FIG. 12, the magnetic target 1202 may be formed from a linear magnetic member 1204 with at least one reversed pole pair. The example of FIG. 12 illustrates the magnetic target 1202 with two reversed pole pairs 1206a and 160b, which may be located any desired locations along the length of the linear magnetic member 1204. The linear magnetic member 1204 may be magnetized perpendicular to its elongate direction. As an example, the shaded regions of FIG. 12 may represent magnetic north poles, while the unshaded regions may represent magnetic south poles, or vice-versa. Because of the reversed pole pairs such as 1206a and 1206b, the magnetic target 1202 may generate a non-uniform magnetic field that can be used to keep track of the linear movement of the magnetic target 1202 along axis 1210 relative to the sensor 1200 (or vice-versa). The magnetic target 1202 may move linearly with respect to the sensors 1200, e.g., along axis 1210. The magnetic sensor 1200 may keep track of the linear position of the magnetic target 1202 by recording the passages, in each direction, of the reversed pole pairs.

FIG. 13 shows an alternative magnetic target 1302 that can be tracked by a magnetic sensor such as sensor 1300. As shown in FIG. 13, a magnetic target 1302 configured for linear sensing by magnetic sensor 1300 may be formed from at least one grouping of pole pairs disposed on either side of a reversed pole pair. FIG. 13 illustrates two such groupings; including reversed pole pair 1306a disposed between pole pairs 1304a and 1308a and reversed pole pair 1306b disposed between pole pairs 1304b and 1308b. The pole pairs and reversed pole pairs of FIG. 13 may be integrated into, attached to, or otherwise disposed at one or more locations along target 1350. As an example, the shaded regions of FIG. 13 may represent magnetic north poles, while the unshaded regions may represent magnetic south poles, or vice-versa.

The target 1350 may translate linearly with respect to sensor 1300 along axis 1310. The linear position of target 1350 along axis 1310 may be recorded by magnetic sensor 1300 using the techniques discussed herein. The magnetic target 1302 may have benefits similar to those discussed herein in connection with FIG. 6.

The technology disclosed herein can be implemented in a variety of electronic systems. Aspects of the disclosure are applicable to any systems and/or devices that could benefit from the magnetic sensing technology disclosed herein.

Aspects of this disclosure can be implemented in various electronic devices. For instance, aspects of this disclosure can be implemented in any electronic device or electronic component that could benefit from the technology disclosed herein. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, other vehicular electronics systems, industrial control electronics systems, etc. Further, the electronic devices can include unfinished products.

Throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

What is claimed is:

1. A method of recording a number of turns with a multi-turn magnetic sensor using an extended magnetic window, the method comprising:

applying a magnetic field at the multi-turn magnetic sensor using a magnetic target, wherein the magnetic field defines a magnetic field vector at the multi-turn magnetic sensor, wherein the magnetic field vector is pointing outside of an area for which domain wall propagation in the multi-turn magnetic sensor is expected, and wherein the magnetic field has a first strength at the multi-turn magnetic sensor below a range for which domain walls predictably propagate through the multi-turn magnetic sensor;

while the magnetic field vector is pointing outside of the area, increasing the strength of the magnetic field using the magnetic target to a second strength at the multi-turn magnetic sensor within the range for which domain walls predictably propagate through the multi-turn magnetic sensor; and while the magnetic field has the second strength at the multi-turn magnetic sensor, adjusting the magnetic field using the magnetic target such that the magnetic field vector is pointing within the area so as to adjust a state of the multi-turn magnetic sensor.

2. The method of claim 1, wherein adjusting the magnetic field comprises rotating the magnetic target relative to the multi-turn magnetic sensor.

3. The method of claim 1, wherein adjusting the magnetic field comprises linearly translating the magnetic target relative to the multi-turn magnetic sensor.

4. The method of claim 1, further comprising:
applying, with an initialization magnet separate from the magnetic target and to the multi-turn magnetic sensor, an initialization magnetic field having a third strength that is within the range for which domain walls predictably propagate through the multi-turn magnetic sensor; and
turning the initialization magnetic field relative to the multi-turn magnetic sensor in order to produce at least one domain wall in the multi-turn magnetic sensor.

5. The method of claim 1, further comprising, while the magnetic field is pointing outside the area, reducing the magnetic field to a third strength below a range for which any propagation of domain walls through the multi-turn magnetic sensor is expected.

6. A multi-turn magnetic sensing system with an extended magnetic window, the multi-turn magnetic sensing system comprising:
a multi-turn magnetic sensor comprising magnetoresistive elements and configured to record a number of turns of a magnetic field based on domain wall propagation through the multi-turn magnetic sensor; and
a magnetic target configured to move between a first position relative to the multi-turn magnetic sensor and a second position relative to the multi-turn magnetic sensor, the magnetic target configured such that:
in the first position, the magnetic target is configured to apply the magnetic field with a first strength at the multi-turn magnetic sensor, the first strength being below a range for which domain walls predictably propagate through the multi-turn magnetic sensor; and
in the second position, the magnetic target is configured to apply the magnetic field with a second strength at the multi-turn magnetic sensor, the second strength being in the range for which domain walls predictably propagate through the multi-turn magnetic sensor.

7. The system of claim 6, wherein the magnetic target comprises:
a first portion of magnetic material that forms a first magnetic dipole; and
a second portion of the magnetic material that forms a second magnetic dipole, wherein the first magnetic dipole is reversed relative to the second magnetic dipole, wherein the first and second portions of the magnetic material are disposed along a substantially circular circumference, and wherein at least some of the first portion of the magnetic material is disposed adjacent to the second portion of the magnetic material.

8. The system of claim 7, wherein, when the magnetic target is in the first position, the second portion of the magnetic material is disposed away from the multi-turn magnetic sensor.

9. The system of claim 7, wherein, when the magnetic target is in the second position, the second portion of the magnetic material is disposed adjacent to the multi-turn magnetic sensor.

10. The system of claim 7, wherein the substantially circular circumference defines a circle having a center, wherein the first magnetic dipole is oriented such that the first magnetic dipole has a north magnetic pole, and a south magnetic pole, wherein the north magnetic pole of the first magnetic dipole is closer to the center of the circle than the south magnetic pole of the first magnetic dipole, and wherein the second magnetic dipole is oriented such that the second magnetic dipole has a south magnetic pole and a north magnetic pole, wherein the south magnetic pole of the second magnetic dipole is closer to the center of the circle than the north magnetic pole of the second magnetic dipole.

11. The system of claim 7, wherein the substantially circular circumference defines a circle that lies in a plane, wherein the first magnetic dipole is oriented such that the first magnetic dipole has a north magnetic pole pointing normal to the plane and a south magnetic pole pointing anti-normal to the plane, and wherein the second magnetic dipole is oriented such that the second magnetic dipole has a south magnetic pole pointing normal to the plane and a north magnetic pole pointing anti-normal to the plane.

12. The system of claim 7, wherein the magnetic target comprises a ring having the substantially circular circumference, and the first and second portions of the magnetic material together span substantially the entire substantially circular circumference of the ring.

13. The system of claim 7, wherein the magnetic target comprises a third portion of the magnetic material that forms a third magnetic dipole, wherein the third magnetic dipole is reversed relative to the second magnetic dipole, and wherein the second portion of the magnetic material is disposed between the first and third portions of the magnetic material.

14. The system of claim 13, wherein, when the magnetic target is in the first position, the second portion of the magnetic material is disposed away from the multi-turn magnetic sensor and, wherein, when the magnetic target is in the second position, the second portion of the magnetic material is disposed adjacent to the multi-turn magnetic sensor.

15. The system of claim 6, wherein the magnetic target comprises a linear magnetic target having an elongated direction and at least one pole pair that is magnetized perpendicular to the elongated direction, wherein the pole pair is closer to the multi-turn magnetic sensor when the magnetic target is in the first position than when the magnetic target is in the second position.

16. A magnetic sensing system with an extended magnetic window, the magnetic sensing system comprising:
a magnetic sensor comprising magnetoresistive elements and configured to record position data based on domain wall propagation through the magnetic sensor; and a magnetic target arranged relative to the magnetic sensor such that:

in a first position relative to the magnetic sensor, the magnetic target is configured to apply a magnetic field with a first strength at the magnetic sensor, the first strength being in a range for which domain walls propagate through the magnetic sensor with a non-zero probability of less than 95%; and in a second position relative to the magnetic sensor, the magnetic target is configured to apply the magnetic field with a second strength at the magnetic sensor, the second strength being in a range for which domain walls predictably propagate through the magnetic sensor.

17. The magnetic sensing system of claim 16, wherein the magnetic target is arranged relative to the magnetic sensor such that, in a third position relative to the magnetic sensor, the magnetic target is configured to apply the magnetic field with a third strength at the magnetic sensor, the third strength being in a range for which domain walls are not expected to propagate through the magnetic sensor.

18. The magnetic sensing system of claim 16, wherein the magnetic target is shaped in a ring and has a plurality of magnetic poles.

19. The magnetic sensing system of claim 16, wherein the magnetic target is shaped in a ring that lies in a plane and wherein the magnetic target has magnetic poles pointing normal to the plane of the ring and pointing anti-normal to the plane of the ring.

20. The magnetic sensing system of claim 16, wherein the magnetic target comprises a linear magnetic target with an elongated direction and wherein the linear magnetic target has magnetic poles pointing perpendicular to the elongated direction of the linear magnetic target.

21. The method of claim 1, wherein:

while the magnetic field vector is pointing outside of the area, maintaining a magnetic angle induced by the magnetic target within a predetermined range of magnetic angles, and while the magnetic field vector is pointing within the area, reversing a sign of the magnetic angle that is outside of the predetermined range of magnetic angles.

22. The system of claim 6, wherein:

the magnetic field defines a magnetic field vector at the multi-turn magnetic sensor, while the magnetic field vector is pointing outside of an area for which domain wall propagation in the multi-turn magnetic sensor is expected, maintaining a magnetic angle induced by the magnetic target within a predetermined range of magnetic angles, and while the magnetic field vector is pointing within the area, reversing a sign of the magnetic angle that is outside of the predetermined range of magnetic angles.

23. The magnetic sensing system of claim 16, wherein:

the magnetic field defines a magnetic field vector at the magnetic sensor, while the magnetic field vector is pointing outside of an area for which domain wall propagation in the magnetic sensor is expected, maintaining a magnetic angle induced by the magnetic target within a predetermined range of magnetic angles, and while the magnetic field vector is pointing within the area, reversing a sign of the magnetic angle that is outside of the predetermined range of magnetic angles.

* * * * *